United States Patent
Koo et al.

(10) Patent No.: US 7,115,446 B2
(45) Date of Patent: Oct. 3, 2006

(54) FLIP CHIP BONDING METHOD FOR ENHANCING ADHESION FORCE IN FLIP CHIP PACKAGING PROCESS AND METAL LAYER-BUILT STRUCTURE OF SUBSTRATE FOR THE SAME

(76) Inventors: Ja Uk Koo, 902-1902 Sinjeong Mael, 1104 Pungdeokcheon 2-dong, Yongin (KR) 449172; Hyoung Chan Kim, 103-307, Sambu Apt. 4663, Sujin 2-dong, Sujeong-gu, Seongnam (KR) 461-707

( * ) Notice: Subject to any disclaimer, the term of this patent is extended or adjusted under 35 U.S.C. 154(b) by 0 days.

(21) Appl. No.: 10/964,371

(22) Filed: Oct. 13, 2004

(65) Prior Publication Data

US 2005/0110163 A1    May 26, 2005

(30) Foreign Application Priority Data

Nov. 25, 2003  (KR) .................... 10-2003-0083891

(51) Int. Cl.
  *H01L 21/44* (2006.01)
(52) U.S. Cl. .................. 438/125; 438/484; 257/669
(58) Field of Classification Search ........... 438/455, 438/458–460, 464–465, 584, 586, 588, 597–599, 438/612, 618, 622, 106, 108, 110–114, 127, 438/197, 199, 206, 212, 229, 231–234, 262, 438/299, 301, 305–306
See application file for complete search history.

(56) References Cited

U.S. PATENT DOCUMENTS

| | | | | |
|---|---|---|---|---|
| 6,576,499 | B1 * | 6/2003 | Funaya et al. | 438/125 |
| 6,888,230 | B1 * | 5/2005 | Ogino et al. | 257/669 |
| 2001/0029088 | A1 * | 10/2001 | Odajima et al. | 438/464 |
| 2002/0133943 | A1 * | 9/2002 | Sakamoto et al. | 29/846 |

* cited by examiner

*Primary Examiner*—Michael Lebentritt
*Assistant Examiner*—Andre' Stevenson
(74) *Attorney, Agent, or Firm*—Keusey, Tutunjian & Bitetto, P.C.

(57) ABSTRACT

A flip chip bonding method and substrate architecture are disclosed for enhancing bonding performance between a chip and a substrate by forming a bump on the chip or the substrate. The flip chip bonding method includes performing pretreatment of a wafer having chips, dicing, and obtaining the pretreated individual chip; performing pretreatment of a substrate; aligning the pads of the pretreated chip with the pads of the pretreated substrate, and bonding the chip and the substrate together by applying an ultrasonic wave and heat using a collet and simultaneously applying pressure. Post treatment is performed by filling or molding resin after bonding. The chip or the substrate is formed with a plated bump, a stud bump or a wedge bump. The stud bump or the wedge bump can be additionally formed on the plated bump.

22 Claims, 22 Drawing Sheets

FLIP CHIP BONDING METHOD FOR ENHANCING ADHESION FORCE IN FLIP CHIP PACKAGING PROCESS AND METAL LAYER-BUILT STRUCTURE OF SUBSTRATE FOR THE SAME

TECHNICAL FIELD

This invention relates to a semiconductor packaging technology, and more particularly to a flip chip bonding method for enhancing a bonding performance between a chip and a substrate by forming a bump on the chip, the substrate, or both the chip and the substrate and for bonding the chip and the substrate using a thermosonic process, and a layer-built structure of the substrate for the same.

BACKGROUND ART

Generally, a wire bonding, a TAP bonding, a flip chip bonding, and the like have been disclosed as methods for bonding a semiconductor chip to a substrate. Meanwhile, the size of an electronic product is gradually minimized, and its performance is more enhanced. The number of bonding pads for input and output has increased, while the size of the chip used in the electronic product has gradually become smaller. Thus, the conventional wire bonding process for bonding the semiconductor chip on the substrate has arrived at its limit. Instead of the wire bonding method, a flip chip bonding method, which is not only superior in view of integrity or performance, but also has no wire connection process and has light weight and short length, has been widely used. The flip chip bonding method is a technology for forming a bump on a bonding pad of a chip and directly bonding the bonding pad of the chip on a lead pad of a substrate without connecting the bonding pad of the chip to the lead pad of the substrate using a metal wire.

FIG. 1 shows a view for explaining a conventional flip chip bonding.

Referring to FIG. 1, a flip chip bonding has a structure that, after forming a stud bump 13 on a bonding pad 12 of a chip 11 cut away from a wafer 10 and flipping the chip 11, the bonding pad 12 of the chip 111 is directly bonded to a lead pad 22 of a substrate 21. Here, the flip chip bonding is classified into a package type flip chip bonding for bonding a flip chip in a ceramic package and a on-board type flip chip bonding for directly bonding a flip chip on a main board.

FIG. 2 is a view showing an example of a package type flip chip bonding, and FIG. 3 is a view showing an example of an on-board type flip chip bonding. Referring to FIG. 2, a chip 11 is bonded to a ceramic package 22 by a flip chip bonding method. At this time, the package is mounted on a main board 25. The ceramic package 22 is sealed by a package cover 26. Referring to FIG. 3, after a chip 11 is directly bonded on a main board 25 by a flip chip bonding method, the part that is connected by bumps 53 is molded by resin and the like.

Meanwhile, in case of bonding a chip on a substrate as described above, a bonding strength or a production yield depends on the kind of a basic substance of the board 21. A conventional layer-built structure of a substrate, as shown in FIG. 4, consists of a basic substance, Cu, Ni, and Au. Specifically, after forming a pattern on the substrate, a surface treatment is performed to enhance an adhesive property. Here, the surface treatment is conventionally performed by plating with Ni or Au. At this time, a substance 21-1 of the substrate is FPCB, FR4, FR5, ceramic, or glass. That is, after coating with a Cu layer 21-2 on the basic substance 21-1, a pattern is formed. Then, a Ni layer 21-3 and an Au layer 21-4 are formed through an electroplating process to perform the surface treatment for enhancing an adhesion property.

However, according to a conventional flip chip bonding method, there have been problems in that, since a thermo-compression method that applies heat and compression when bonding a chip to a substrate is employed, a process rate is slow, the chip may be damaged due to high heat and compression, and, in case that a substrate to which a c hip is bonded or a pad of a wafer has a weak material, electrical bonding property deteriorates.

Further, according to a conventional layer-built structure of a substrate, there has been a problem in that, since a bonding strength or a production yield greatly depends on the kind of a basic substance of the substrate, inferior product may be generated.

SUMMARY

Therefore, the invention has been made in view of the above problems, and it is an object of the invention to provide a flip chip bonding method for obtaining high reliability and productivity by speeding up process rate and for enhancing bonding performance.

Further, it is another object of the invention to provide a metal-layered architecture of a substrate for flip chip bonding for maintaining a bonding strength and enhancing a production yield regardless of a kind of basic substance by adding a buffer layer with a hard metal to the substrate.

In accordance with the present invention, the above objects are accomplished by a flip chip bonding method comprising the steps of: performing pretreatment of a wafer having chips, dicing it, and obtaining the pretreated individual chip; performing pretreatment of a substrate; aligning the pads of the pretreated chip with the pads of the pretreated substrate, and bonding the chip and the substrate together by applying an ultrasonic wave and heat using a collet and simultaneously applying pressure; and performing post treatment for filling or molding resin after bonding. Here, the bump of the substrate may have the same size as the bump of the chip or any one of the bump of the substrate and the bump of the chip may have a larger size than the other. The circuit part of the substrate may be plated with Sn. The flip chip bonding may be performed without damaging the pad of the chip, even though the wafer having a weak pad is used.

Further, the above objects are accomplished by a metal layer-built structure according to the invention comprising: a substrate which is formed with a copper thin film pattern on a basic substance; a hard metal layer which is formed by plating a metal having a high hardness on the substrate; and a conductive metal layer which is formed by plating a metal having a high conductivity on the hard metal layer. Thus, a bonding strength is maintained and a production yield is enhanced irrespective of the kind of the basic substance.

BRIEF DESCRIPTION OF THE DRAWINGS

The above and other objects, features and other advantages of the invention will be more clearly understood from the following detailed description taken in conjunction with the accompanying drawings, in which.

DETAILED DESCRIPTION OF PREFERRED EMBODIMENTS

The invention will be described in further detail by way of preferred embodiments with reference to the accompanying drawings.

Figure 5:
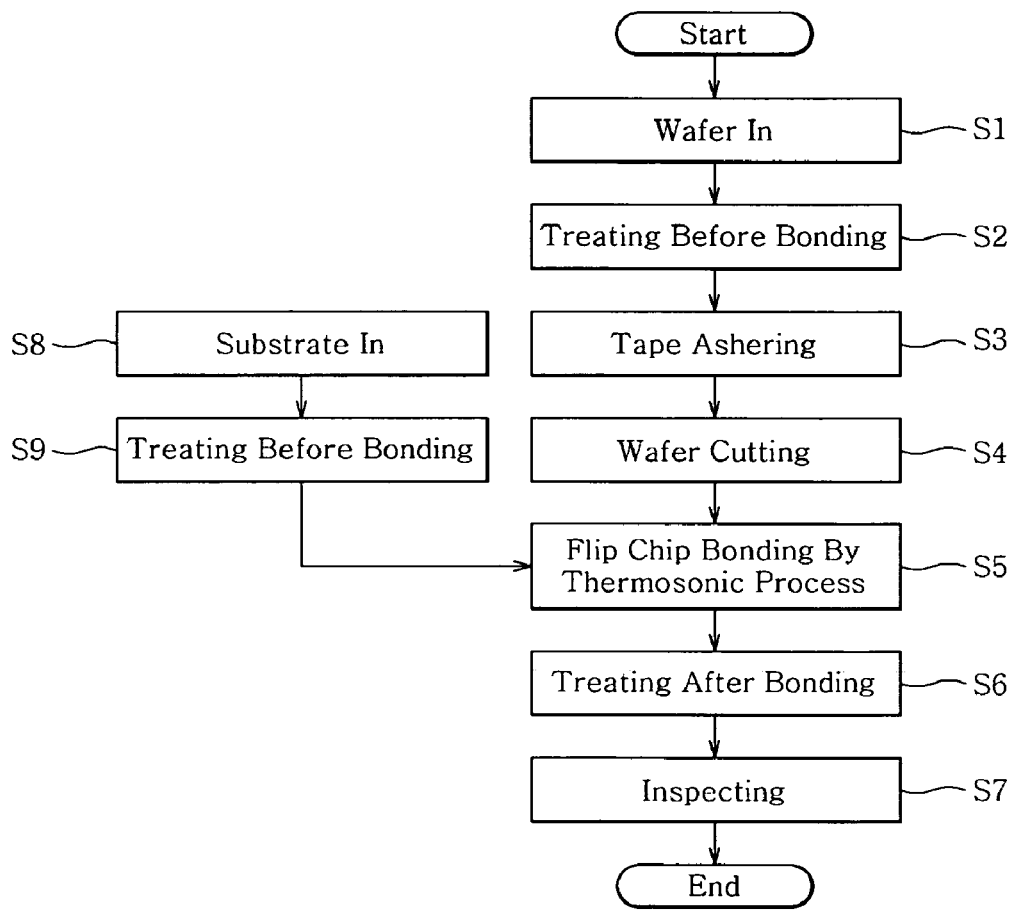
FIG. 5 is a flow diagram showing a flip chip packaging process for enhancing a bonding property according to the invention.

FIG. 5 is a flow diagram showing a flip chip packaging process according to the invention.

A flip chip packaging method of the invention, as shown in FIG. 5, comprises bonding pretreatment steps for receiving a wafer and for performing a pretreatment for bonding on a bonding pad of the wafer (S1 and S2), a step for adhere a tape (S3), a step for transferring the wafer (S4), a step for performing a pretreatment for bonding on a lead pad of a substrate (S5 and S6), a step for bonding a flip chip by a thermosonic process (S7), a bonding post treatment step (S8), and inspecting step (S9).

Referring to FIG. 5, the bonding pretreatment step S2 for a wafer 10 may be any one selected from processes including forming a stud bump made of Au, Al, or Cu on an Aluminum pad 12 of the wafer 10, forming a wedge bump with the same metal by wedge bonding, forming by evaporating a Au plated bump, Al, or Ag on an aluminum pad 12, and forming a first plated bump and then forming a stud bump or a wedge bump, which is made of Au, Ag, Al, or Cu, on the first plated bump.

Further, the bonding pretreatment step S9 for a substrate 21 may be any one selected from processes including forming a stud bump or a wedge bump, which is made of Au, Cu, or Al, on an aluminum pad 22 of the substrate 21, forming an Au plated bump on an aluminum pad 22, and applying Anisotropic Conductive Film (ACF), Anisotropic Conductive Paste (ACP), N on Conductive Film (NCF), and N on Conductive Paste (NCP) on the substrate. Here, the substrate 21 to which a semiconductor chip 11 is bonded may be any one selected from ceramic, PCB, and FPCB.

[Formation of Plated Bump]

Figure 6:
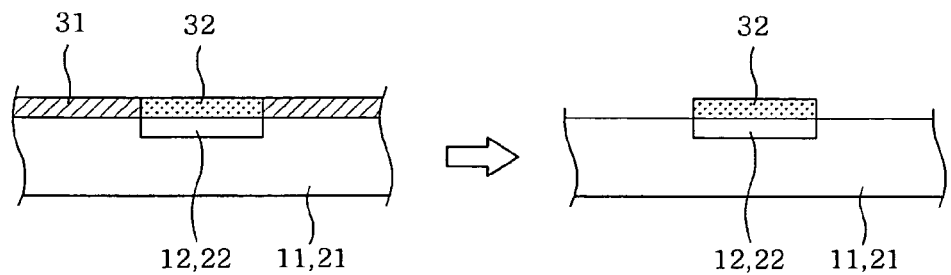
FIG. 6 is a view showing a process for forming a plated bump according to the invention.

A method for a plated bump 32 on the wafer 10 or the substrate according to the invention, as shown in FIG. 6, comprises the steps of covering a protection film 31 except for the pad 12 or 22 in the wafer 10 or the substrate 21, evaporating Au or Al or evaporating Ni and then evaporating Au on an upper surface thereof using a conventional plating method, such as an electrolytic plating or an electroless plating, and forming the plating bump 32 by removing the protection film 31.

Figure 1:
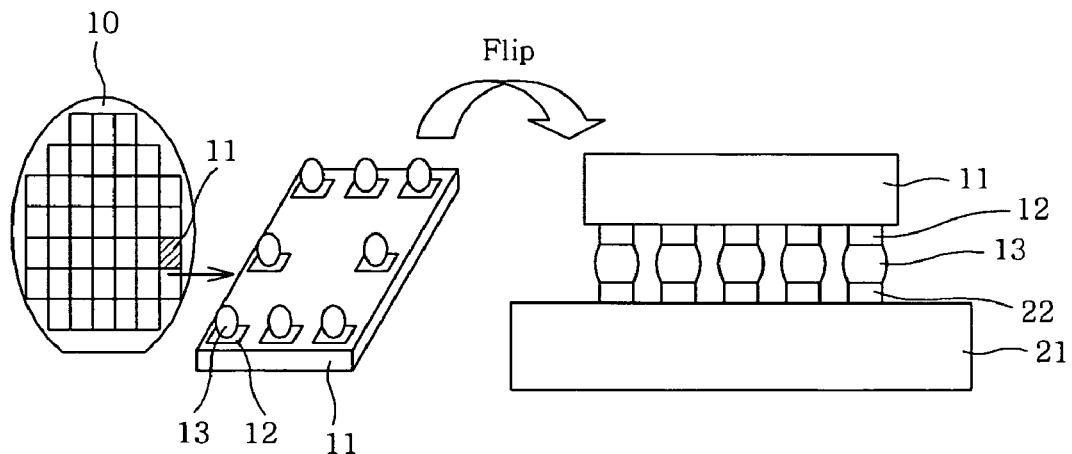
FIGS. 1 to 3 are views for explaining a conventional flip chip bonding.
Figure 2:
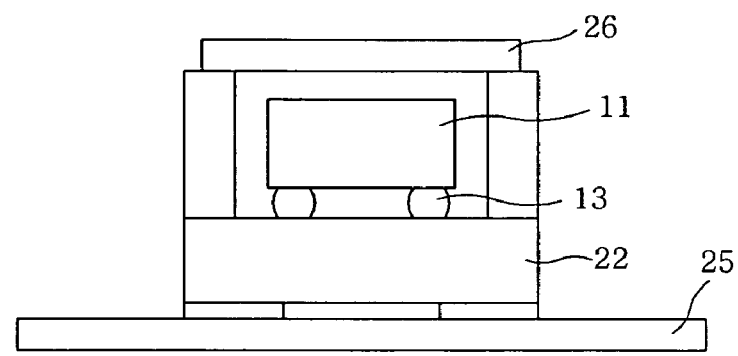
Figure 3:
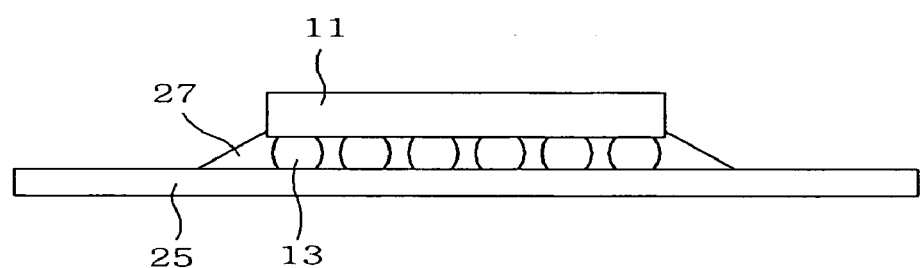
Figure 4:
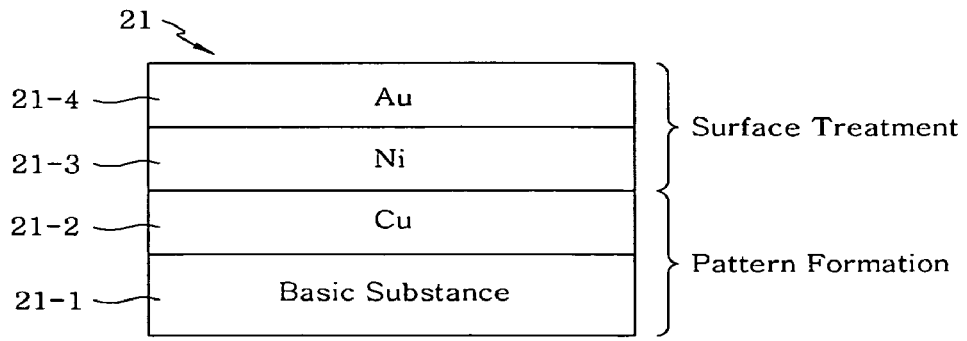
FIG. 4 is a view showing a layer-built structure of a conventional substrate for flip chip bonding.
Figure 7:
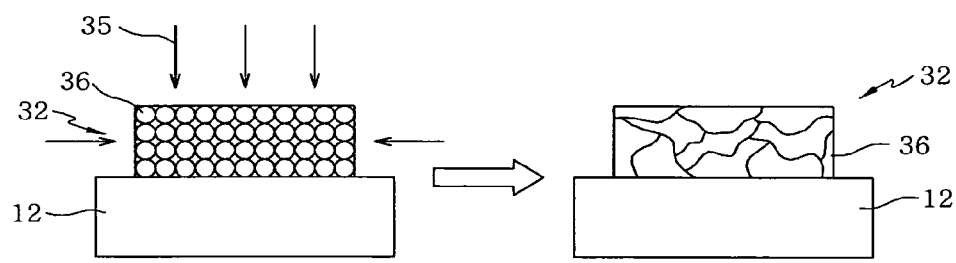
FIGS. 7 to 9 are views showing a method for giving an annealing effect to enhance an adhesion property of a plated bump according to the invention.
Figure 8:
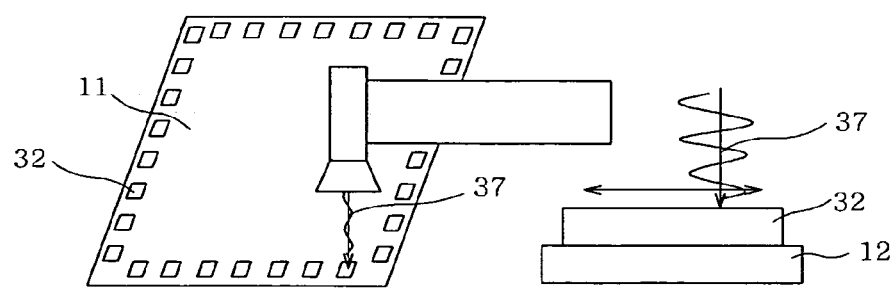
Figure 9:
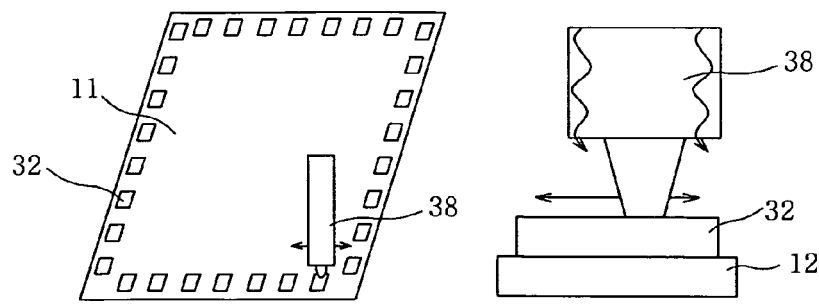

Further, the plated bump 32 formed on the wafer 10 or the substrate 21 is made of Au particles. Thus, in order to increase an adhesion force of the plated bumps 32, as shown in FIGS. 3b, 3c and 3d, an annealing effect may be applied to make a size of Au particles 36 large. Specifically, FIG. 7 is a view showing a status for giving a n annealing effect on the formed plated bump by applying a heat, FIG. 8 shows an example which gives an annealing effect by applying laser beam 37 to the plated bump 32, and FIG. 9 shows an example which gives an annealing effect by processing the plated bump 32 with a coming capillary 38.

[Formation of Doping Bump]

Figure 10:
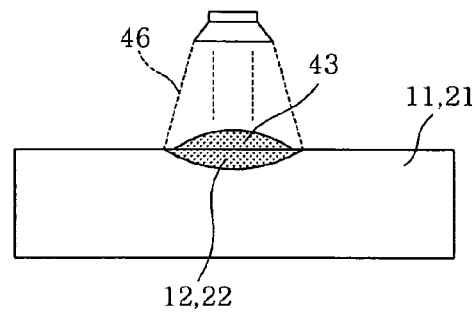
FIG. 10 is a view showing a process for forming a doping bump on a substrate according to the invention.

FIG. 10 shows a method for forming a doping bump on a substrate according to the invention. A doping bump 53 may be formed by a doping method for partially projecting particles 46 of Au, Ag, or Cu on the substrate or the wafer and growing the particles. Here, a pad 22 of the substrate that is plated with Au, Cu, Al, or Sn may be used.

[Formation and Shape of Stud Bump]

Figure 11:
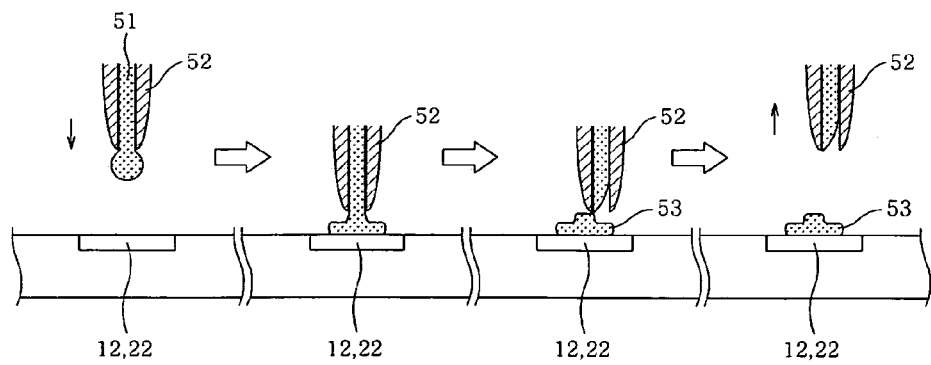
FIG. 11 is a view showing a process for forming a stud bump according to the invention.

According to a method for forming a stud bump 53 on the wafer 10 or the substrate 21, the stud bump 53, as shown in FIG. 11, is formed on the pad 12 or 22 using a capillary 52 into which a gold wire 51 is inserted. Specifically, while applying are to the gold wire 51 and melting the gold wire 51, the melted gold within the capillary 52 is contacted on a pad of the wafer 10 or the substrate 21. Then, the melted gold is adhered to the pad by applying an ultrasonic wave. Then, the capillary 52 is moved a little in the direction of a transverse axis to flatten a projected portion. Then, the capillary 52 is moved upward. As a result, only the stud bump 53 is left behind on the pad.

Figure 12:
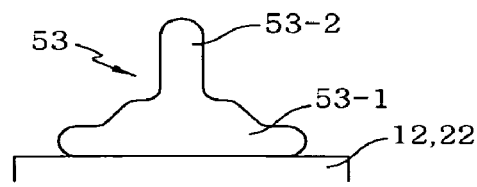
FIGS. 12 to 16 are views showing the examples of a stud bump according to the invention.
Figure 13:
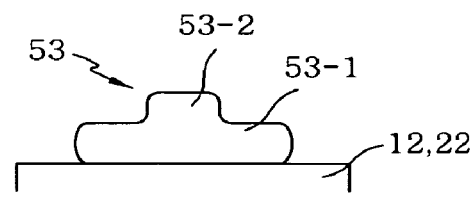
Figure 14:
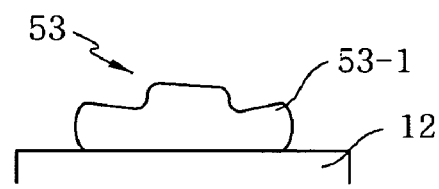
Figure 15:
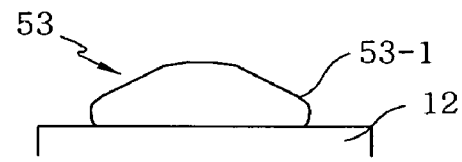
Figure 16:
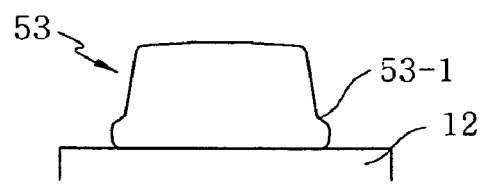

The stud bump 53 formed by the above method may have various shapes. That is, as shown if FIG. 12, the stud bump 53 may have a body portion 53-1 and a long neck portion 53-2 formed in the center of the body portion 53-1. Further, as shown in FIG. 13, the stud bump 53 may have a short neck portion 53-2 formed on a body portion 53-1. Further, as shown in FIG. 14, the stud bump 53 may have a convex shape without having projection in the center of a body portion 53-1. Further, as shown in FIG. 15, the stud bump 53 may have a body portion 53-1 having a trapezoid shape without having the neck portion 53-2 in the center of the body portion. Further, as shown in FIG. 16, the stud bump 53 may have a very thick body portion 53-1 without having the neck portion 53-2. Since a noxious flux is not used in the stud bump forming process, the stud bump forming process is environmentally friendly and simple compared to a soldering method.

[Formation and Shape of Wedge Bump]

Figure 17:
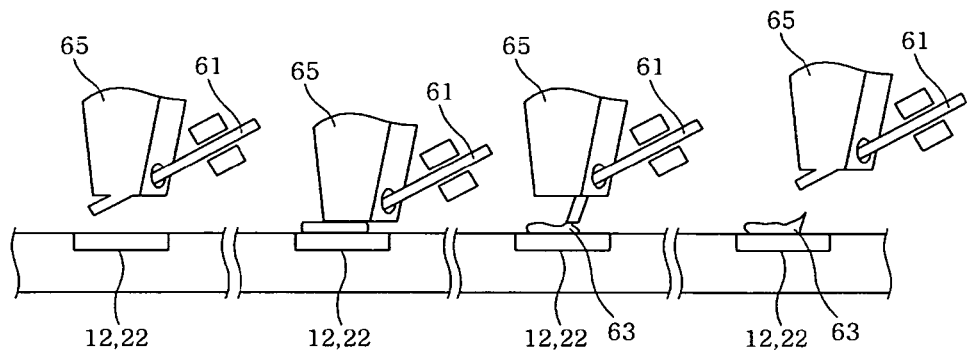
FIG. 17 is a view showing a process for forming a wedge bump according to the invention.

According to a method for forming a wedge bump 63 on the wafer 10 or the substrate 21 according to the invention, as shown in FIG. 17, the wedge bump 63 is formed on the pad 12 or 22 using a wedge bonding tool 65 into which a gold wire 61 or a high conductive wire that is made of Al, Cu, or Ag is inserted. Specifically, after inserting the gold wire 61, the aluminum wire 61-2 or the copper wire 61-3 into the wedge bonding tool 65, the melted gold within the wedge bonding tool 65 is contacted on a pad of the wafer 10 or the substrate 21. Then, the melted gold is adhered to the pad by applying ultrasonic wave. Then, the wedge bonding tool 65 is moved a little in the direction of a transverse axis to adhere each wire. Then, each wire is immediately cut. As a result, the wedge bump 63 is formed on the wafer 10 or the substrate 21.

Figure 18:
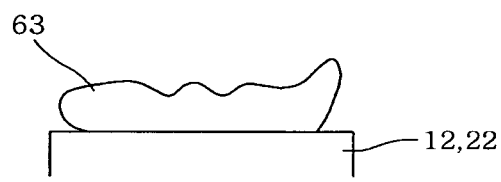
FIGS. 18 to 20 are views showing examples of a wedge bump according to the invention.
Figure 19:
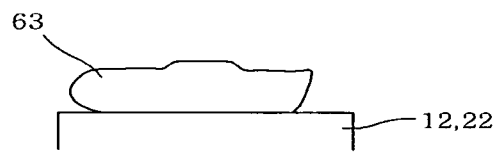
Figure 20:
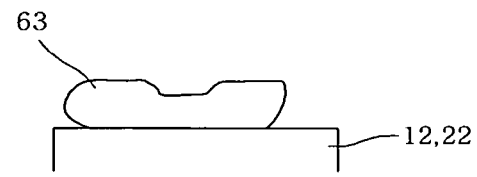

The wedge bump 63 formed by the above method has various shapes. That is, FIGS. 18 to 20 show the wedge bumps 63 having two projections, one projection and no projection, respectively. The shape of the wedge bump 63 depends on the shapes of various wedge tools.

[Tape Adhesion Process]

Figure 21:
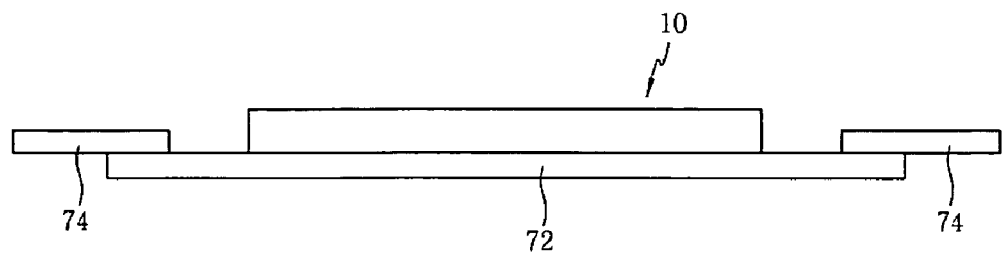
FIG. 21 is a view showing an example of a tape adhesion process shown in FIG. 5.

Meanwhile, in the step S3 for adhering a tape 72 to the pretreated wafer 10, in case of dicing the wafer 10 on which the stud bump is formed, a die, that is, a chip, is fixed by the tape so that the die is not individually separated. According to a vertically sectioned structure upon adhering the tape, as shown in FIG. 21, while the tape 72 is supported by a frame ring 74 positioned at both ends thereof, the wafer 10 is placed on an adhesive surface of the tape and then adhered to it.

[Wafer Cutting Process]

Figure 22:
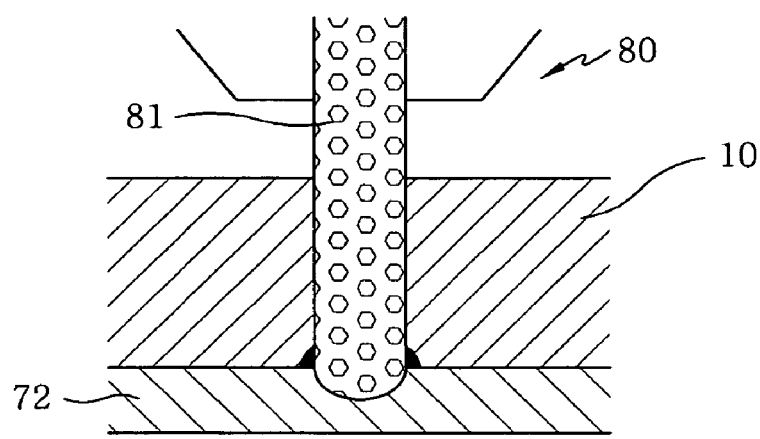
FIG. 22 is a view showing an example of a wafer cutting process shown in FIG. 5.

In the wafer cutting step S4, a chip of a wafer status is individually separated by a cutter. According to a sectional side elevation shown in FIG. 22, even if a blade 81 of a cutter 80 completely cuts a wafer 10 and partially cuts a tape 72, chip 11 is not individually separated by the tape 72.

[Bonding Process]

Figure 23:
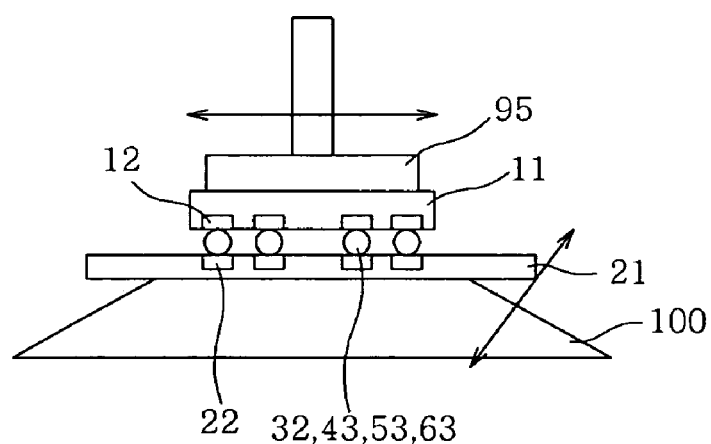
FIG. 23 is a view showing an example of a flip chip bonding device developed according to the invention.

FIG. 23 is a schematic view showing a bonding device upon bonding a flip chip according to the invention. The bonding device comprises a collet 95 for holding a chip 11, and a block 100 for supporting a substrate 21.

Referring to FIG. 23, in order to transfer an ultrasonic waves to the chip, the collet 95 holding the chip 11 may vibrate in the direction of an X axis, and the block 100 supporting the substrate 21 may vibrate in the direction of a Y axis. Further, the collet 95 may vibrate in the direction of the Y axis, and the block 100 may vibrate in the direction of the X axis. Further, the collet 95 and the block 100 may transfer the ultrasonic waves while intersecting in the direction of the same axis. Each of the above transmission methods may be used together with a conventional method that transfers the ultrasonic wave only from the collet 95. Thus, since the ultrasonic waves may be transferred to the substrate 21 as well as the chip 11, a flip chip bonding process is completed in a short time, and an adhesion strength between the chip 11 and the substrate 21 is increased. As a result, a production yield is enhanced.

[Definition of Collet and Surface Treatment Method]

Figure 24:
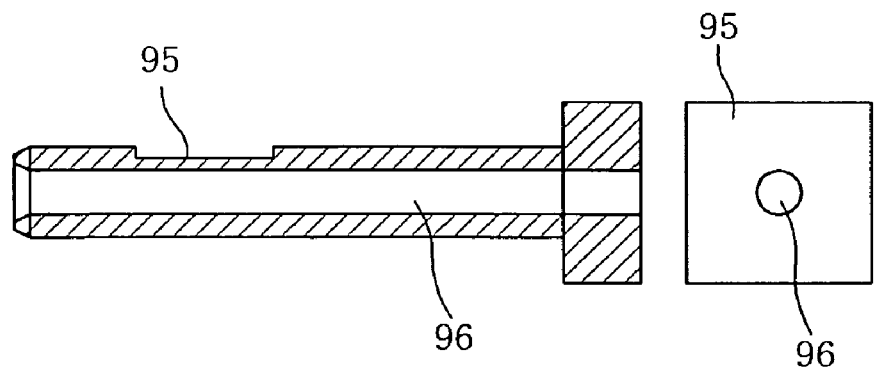
FIGS. 24 to 27 are views showing examples of a design of a collet developed according to the invention.
Figure 25:
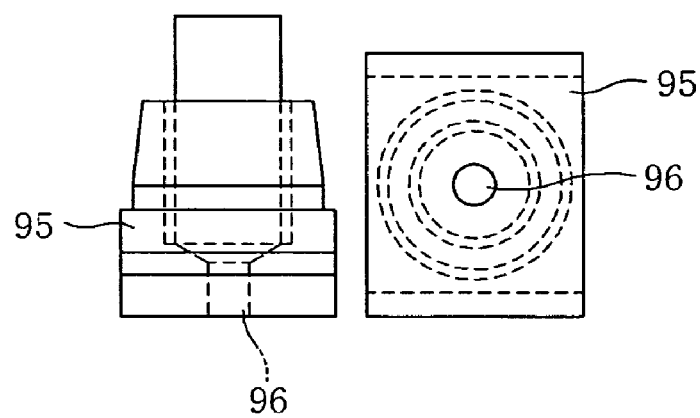

Here, since the collet 95 transferring the ultrasonic energy to the chip, as shown in FIGS. 24 and 25, is formed with a vacuum hole 96 in the center thereof, it serves to hold the chip 11 using a vacuum pressure and to transfer the ultrasonic energy.

Figure 26:
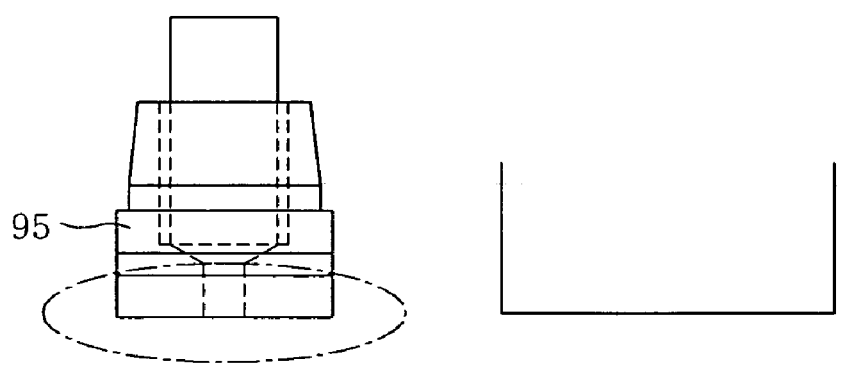
Figure 27:
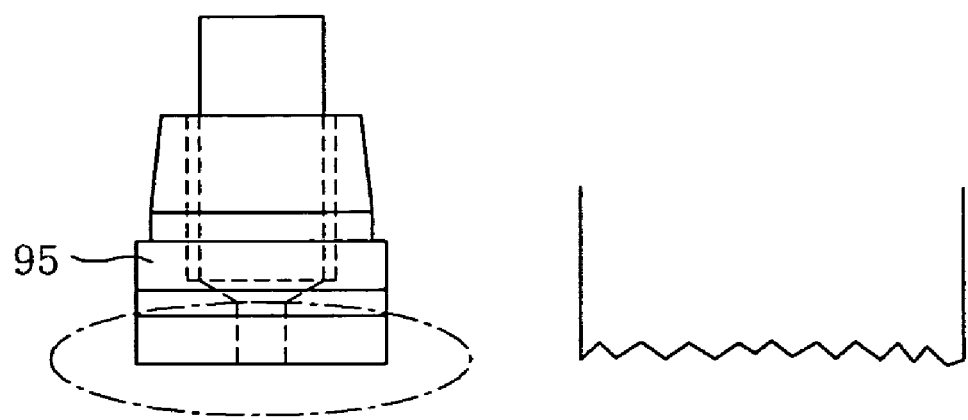

The above collet 95 is classified into a polish type that polishes a contact surface as shown in FIG. 26, and a matt type that roughly treats a contact surface as shown in FIG. 27.

Further, the collet is manufactured using a material for enduring ultrasonic waves, such as Zr, Ti, ceramic, stainless alloy, titanium alloy, for example, TiW or TiC, and the like.

Figure 28:
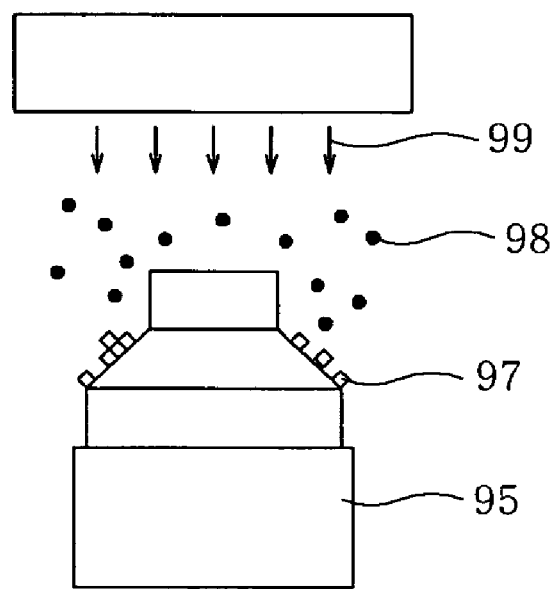
FIG. 28 is a view showing a coating method for minimizing the loss of an ultrasonic energy of a collet according to the invention.

Further, the collet 95, as shown in FIG. 28, may be treated by diamond like carbon (DLC) coating to prevent the loss of the ultrasonic energy. Here, the DLC coating is made by growing a carbon atom 98 on the surface of the collet 95 using sputtering 99 or CVD (chemical vapor deposition) and forming a diamond layer. If the diamond like carbon thin film 97 is coated on the outer surface of the collet, the outside loss of ultrasonic energy transferred from a transducer is minimized, and, thus, the ultrasonic energy is efficiently transferred to the chip.

[Bonding Structure]

A bonding structure of the invention for flip chip bonding when a chip 11 is bonded on a pretreated substrate 21 has various structures as described in the following Table 1 according to the method for forming a bump on a pad 22 of the substrate and a pad 12 of the chip.

TABLE 1

| Example (Drawing) | Condition of substrate | Condition of chip |
|---|---|---|
| Example 1 (FIG. 29) | Stud bump is formed | Plated bump is formed |
| Example 2 (FIG. 30) | Bare | Plated bump is formed |
| Example 3 (FIG. 31) | Stud bump is formed | Plated bump and stud bump are formed |
| Example 4 (FIG. 32) | Bare | Plated bump and stud bump are formed |
| Example 5 (FIG. 33) | Stud bump is formed | Stud bump is formed |
| Example 6 (FIG. 34) | Stud bump is formed | Bare |
| Example 7 (FIG. 35) | Bare | Stud bump is formed |
| Example 8 (FIG. 36) | Bare + Adhesive (ACF, ACP, NCF, or NCP) application | Stud bump is formed |
| Example 9 (FIG. 37) | Bare + Adhesive (ACF, ACP, NCF, or NCP) application | Plated bump is formed |
| Example 10 (FIG. 38) | Plated bump is formed | Plated bump is formed or not. |

EXAMPLE 1

Figure 29:
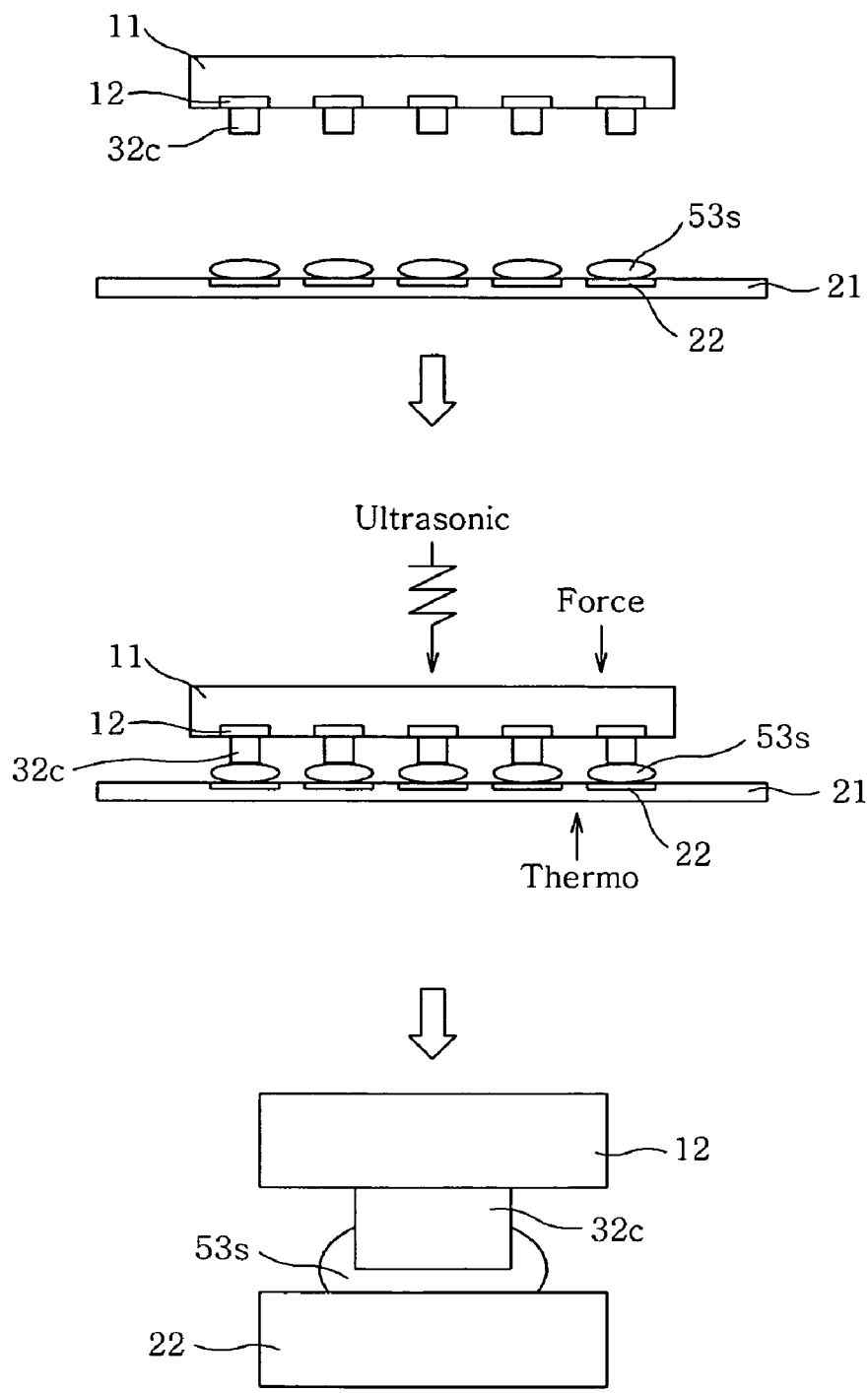
FIGS. 29 to 38 are views showing examples of a structure for bonding a substrate and a chip according to the invention.

FIG. 29 is a view showing the process for a flip chip bonding between a substrate that is formed with a stud bump and a chip that is formed with a plated bump using a thermosonic method according to the invention.

Referring to FIG. 29, an aluminum bonding pad 12 of a chip 11 is formed with a plated bump 32c that is made of Au, Al, or Ni coated with Au. A lead pad 22 of a substrate 21 is formed with a stud bump 53s that is made of Au or Cu. In the flip chip bonding process S5, after the chip 11 and the substrate 21 are closely contacted, heat is applied to the substrate 21, and an ultrasonic wave of 70 KHz or more is applied to the chip 11 through a collet 95. Simultaneously, pressure is applied to the substrate 21. As a result, the plated bump 32c of the chip and the stud bump 53s of the substrate are bonded by energy generated from the heat, the ultrasonic wave and the pressure. Here, the collet 95 that is made of Zr, Ti, ceramic, stainless alloy, TiW alloy, TiC, and the like, is manufactured to have a little smaller size than that of each chip.

EXAMPLE 2

Figure 30:
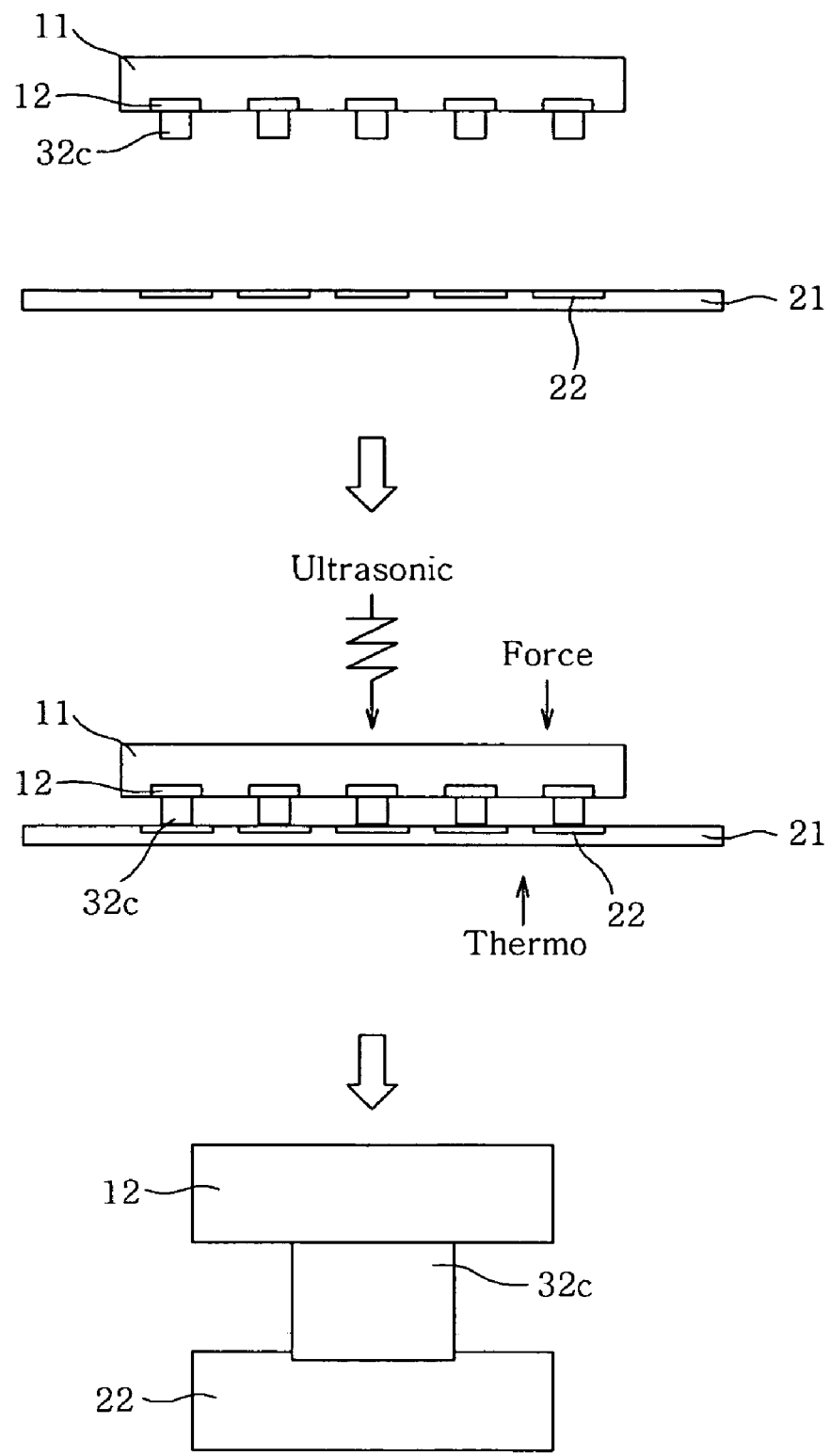

FIG. 30 is a view showing the process for a flip chip bonding between a bare substrate and a chip that is formed with a plated bump u sing a thermosonic method according to the invention.

Referring to FIG. 30, an aluminum bonding pad 12 of a chip 11 is formed with a plated bump 32c that is made of Au, Al, or Ni coated with Au. A lead pad 22 of a substrate 21 is bare of any bump. In the flip chip bonding process S5, after the chip 11 and the substrate 21 are closely contacted, heat is applied to the substrate 21, and an ultrasonic wave is applied to the chip 11 through a collet 95. Simultaneously, pressure is applied to the substrate 21. As a result, the plated bump 32c of the chip and the lead pad 22 of the substrate are bonded by energy generated from the heat, the ultrasonic wave and the pressure.

EXAMPLE 3

Figure 31:
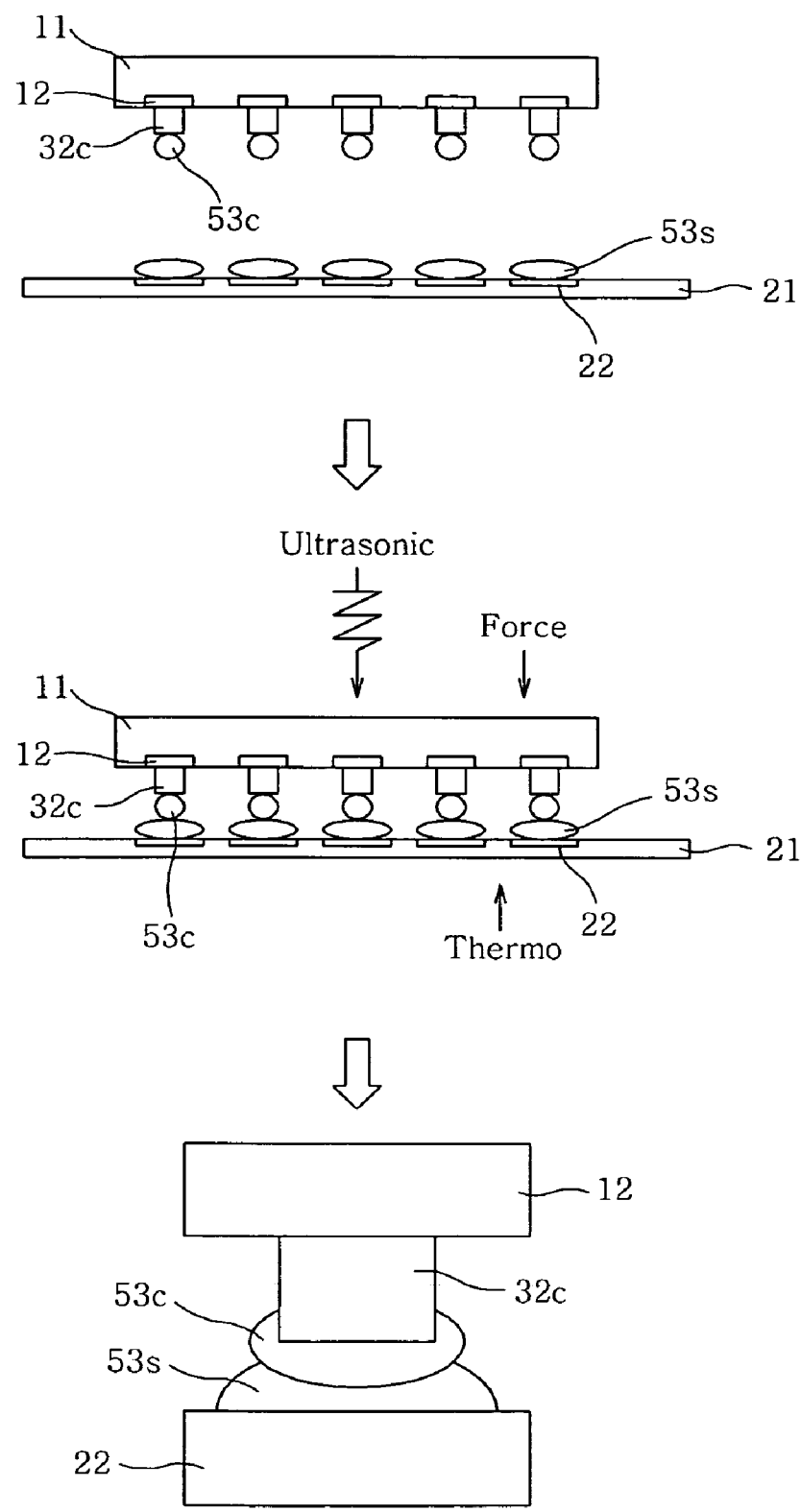

FIG. 31 is a view showing the process for a flip chip bonding between a substrate that is formed with a stud bump and a chip that is formed with a plated bump and a stud bump formed on the plated bump using a thermosonic method according to the invention.

Referring to FIG. 31, an aluminum bonding pad 12 of a chip 11 is formed with a plated bump 32c that is made of Au, Al, Ag, Cu or Ni coated with Au. A stud bump 53c is again formed on the plated bump 32c. A lead pad 22 of a substrate 21 is formed with a stud bump 53s. In the flip chip bonding process S5, after the chip 11 and the substrate 21 are closely contacted, heat is applied to the substrate 21, and an ultrasonic wave of 70 KHz or more is applied to the chip 11 through a collet 95. Simultaneously, pressure is applied to the substrate 21. As a result, the stud bump 53c of the chip 11 and the stud bump 53s of the substrate are bonded by energy generated from the heat, the ultrasonic wave of 70 KHz or more and the pressure.

EXAMPLE 4

Figure 32:
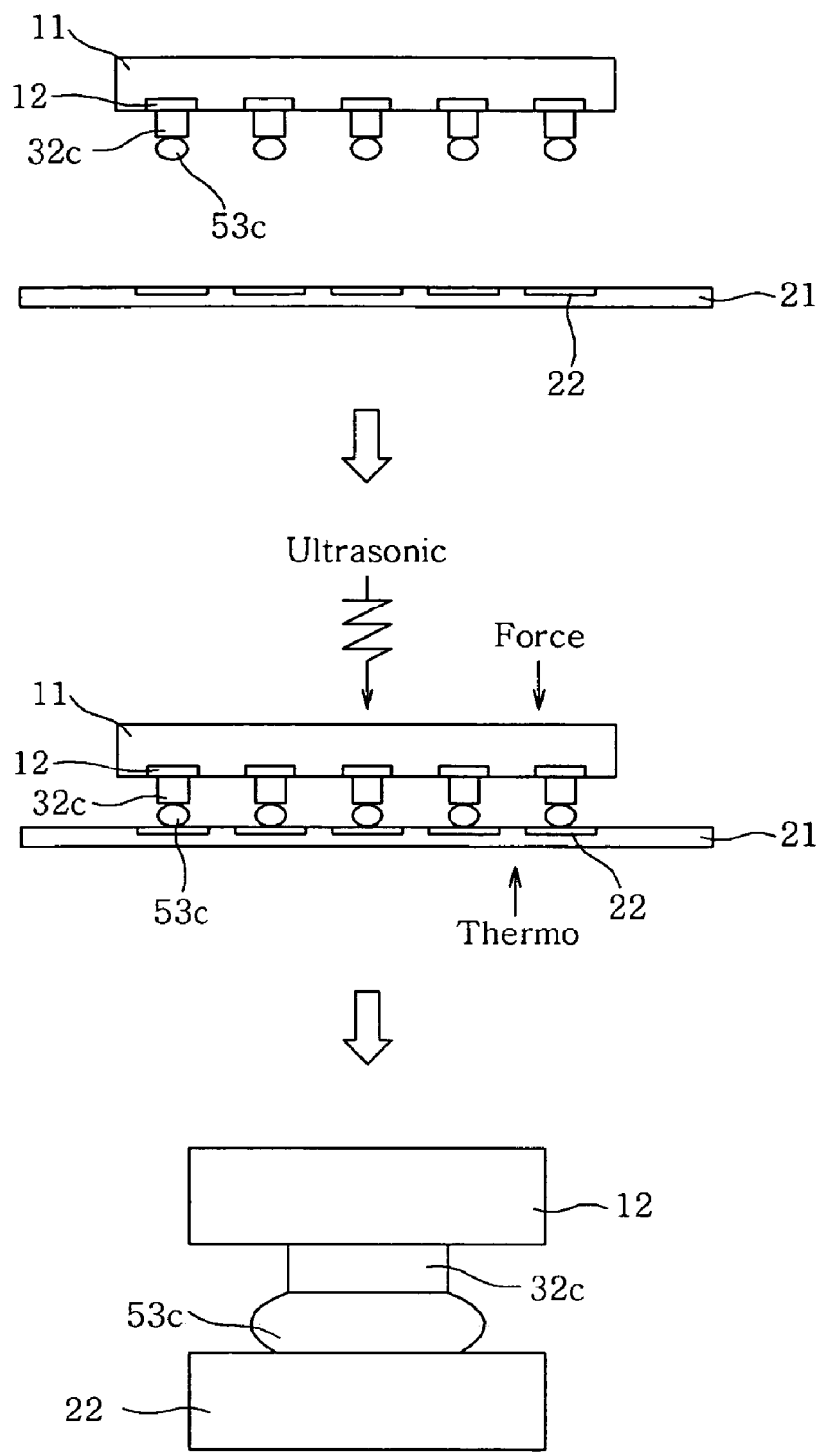

FIG. 32 is a view showing the process for a flip chip bonding between a base substrate and a chip that is formed with a plated bump and a stud bump formed on the plated bump using a thermosonic method according to the invention.

Referring to FIG. 32, an aluminum bonding pad 12 of a chip 11 is formed with a plated bump 32c that is made of Au, Al, or Ni coated with Au. A stud bump 53c is again formed on the plated bump 32c. A lead pad 22 of a substrate 21 is bare of any bump. In the flip chip bonding process S5, after the chip 11 and the substrate 21 are closely contacted, heat is applied to the substrate 21, and an ultrasonic wave is applied to the chip 11 through a collet 95. Simultaneously, pressure is applied to the substrate 21. As a result, the stud bump 53c of the chip and the lead pad 22 of the substrate are bonded by energy generated from the heat, the ultrasonic wave of 70 KHz or more and the pressure.

EXAMPLE 5

Figure 33:
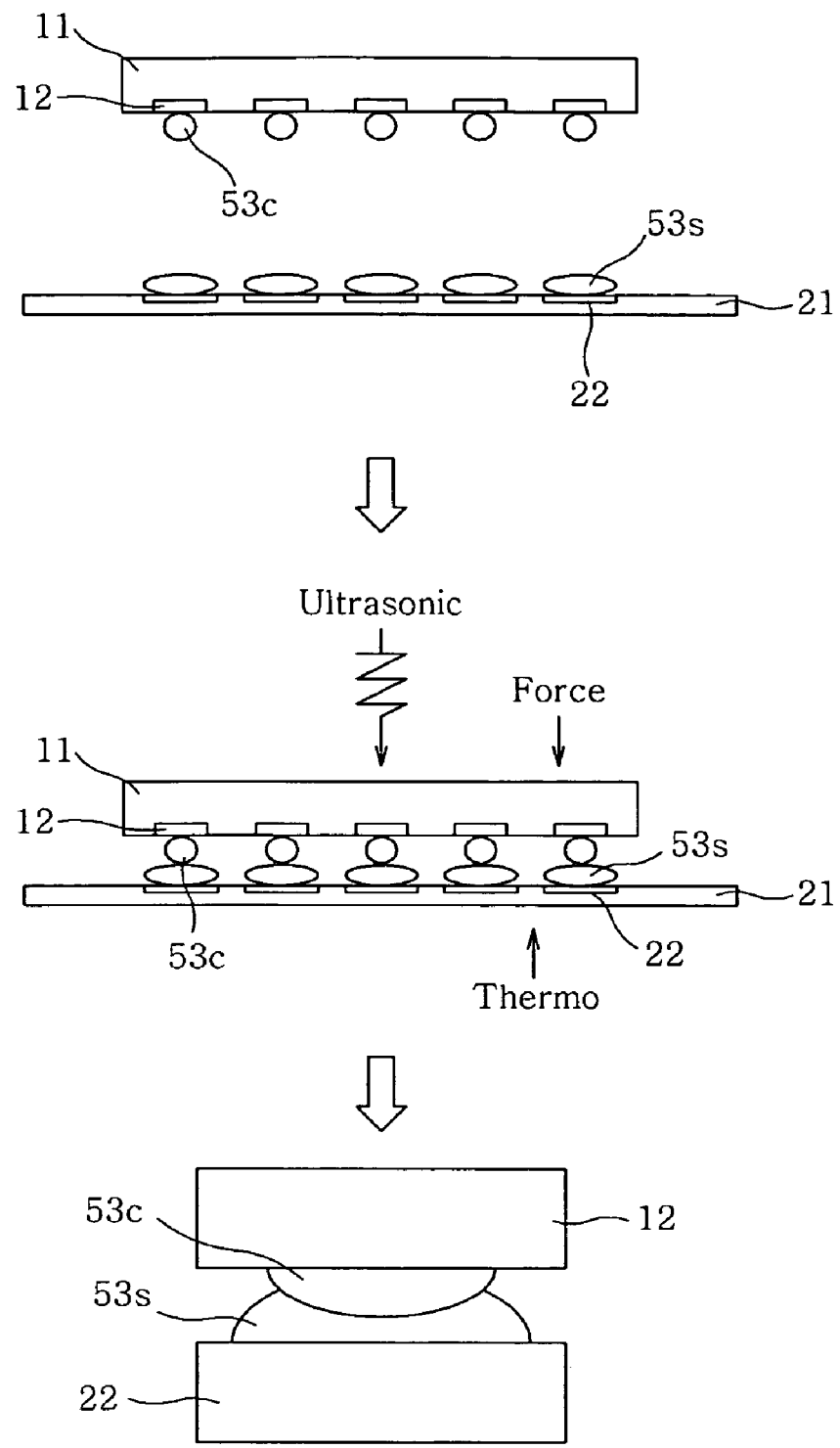

FIG. 33 is a view showing the process for a flip chip bonding between a substrate that is formed with a stud bump 53s and a chip that is formed with a stud bump 53c using a thermosonic method according to the invention.

Referring to FIG. 33, an aluminum bonding pad 12 of a chip 11 is formed with a stud bump 53c that is made of Au or Cu. A lead pad 22 of a substrate 21 is formed with a stud bump 53s that is made of Au or Cu. In the flip chip bonding process S5, after the chip 11 and the substrate 21 are closely contacted, heat is applied to the substrate 21, and an ultrasonic wave is applied to the chip 11 through a collet 95. Simultaneously, pressure is applied to the substrate 21. As a result, the stud bump 53c of the chip and the stud bump 53s of the substrate are bonded by energy generated from the heat, the ultrasonic wave and the pressure.

EXAMPLE 6

Figure 34:
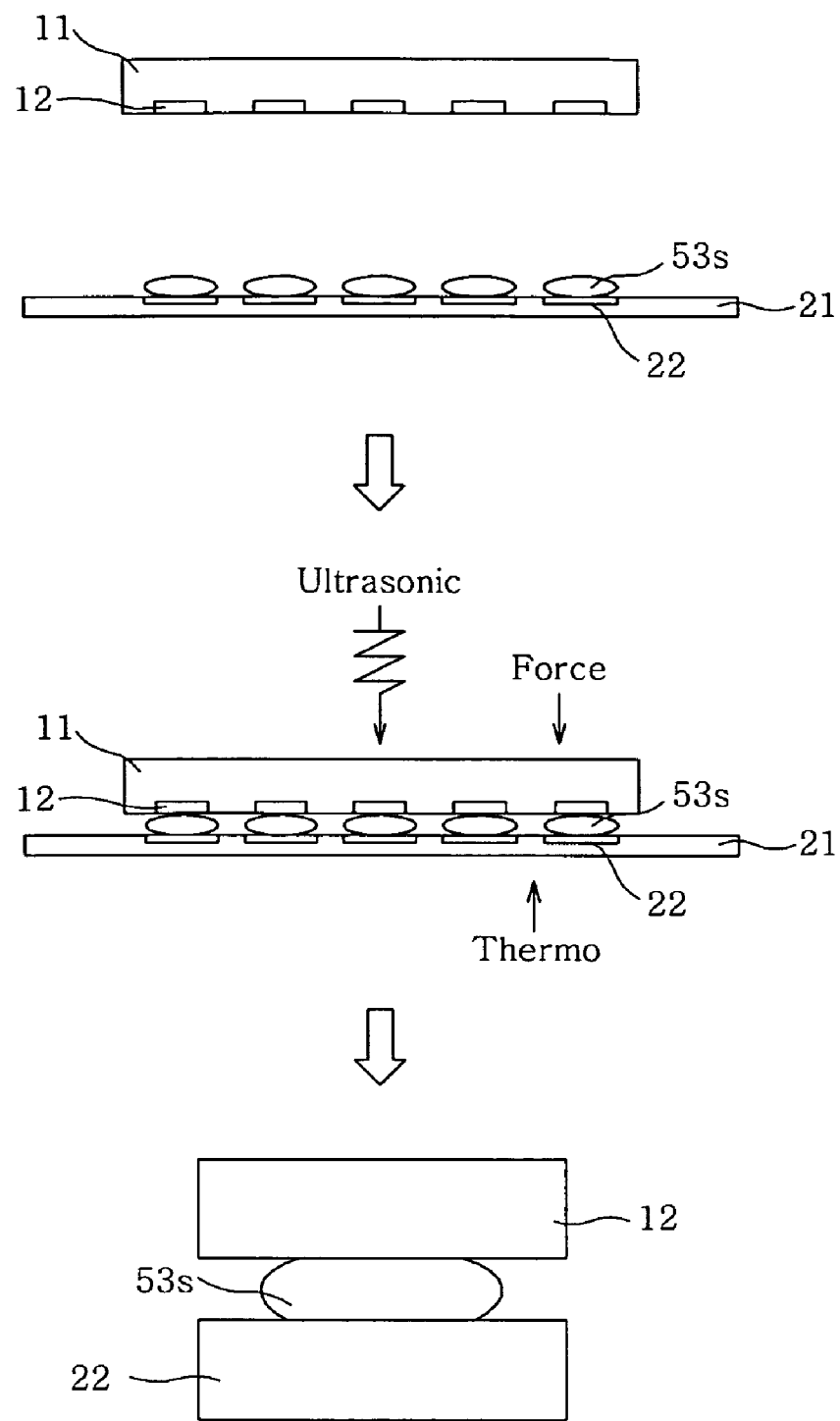

FIG. 34 is a view showing the process for a flip chip bonding between a substrate that is formed with a stud bump 53s and a chip that is formed with a basic aluminum pad using a thermosonic method according to the invention.

Referring to FIG. 34, an aluminum bonding pad 12 of a chip 11 is bare of any bump. A lead pad 22 of a substrate 21 is formed with a stud bump 53s that is made of Au or Cu. In the flip chip bonding process S5, after the chip 11 and the substrate 21 are closely contacted, heat is applied to the substrate 21, and an ultrasonic wave is applied to the chip 11 through a collet 95. Simultaneously, pressure is applied to the substrate 21. As a result, the bonding pad 12 of the chip and the stud bump 53s of the substrate are bonded by energy generated from the heat, the ultrasonic wave and the pressure.

EXAMPLE 7

Figure 35:
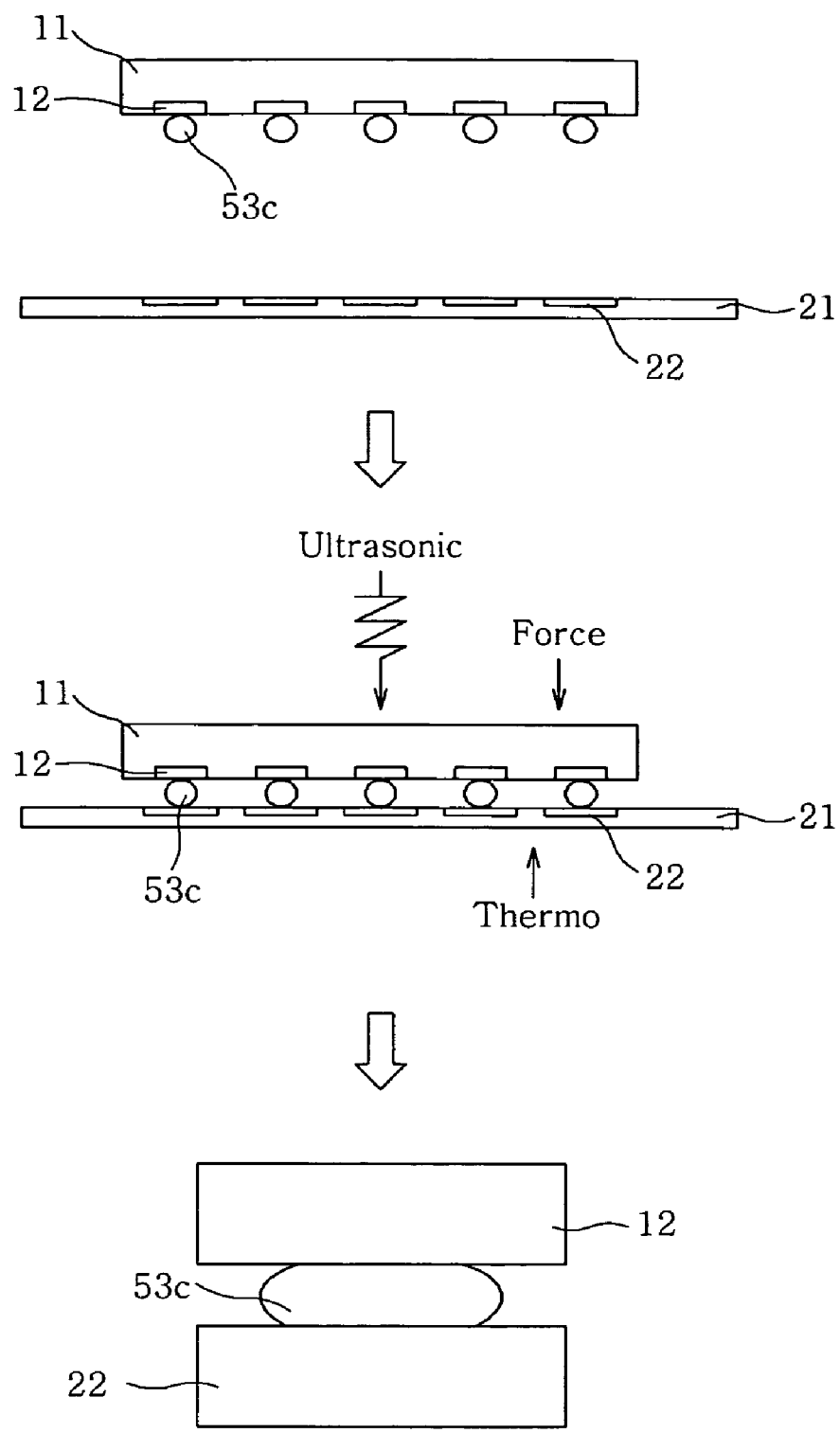

FIG. 35 is a view showing the process for a flip chip bonding between a base substrate and a chip that is formed with a stud bump 53c using a thermosonic method according to the invention.

Referring to FIG. 35, an aluminum bonding pad 12 of a chip 11 is formed with a stud bump 53c that is made of Au or Cu. A lead pad 22 of a substrate 21 is bare of any bump. In the flip chip bonding process S5, after the chip 11 and the substrate 21 are closely contacted, heat is applied to the substrate 21, and an ultrasonic wave is applied to the chip 11 through a collet 95. Simultaneously, pressure is applied to the substrate 21. As a result, the stud bump 53c of the chip and the lead pad 22 of the substrate 21 are bonded by energy generated from the heat, the ultrasonic wave and the pressure.

EXAMPLE 8

Figure 36:
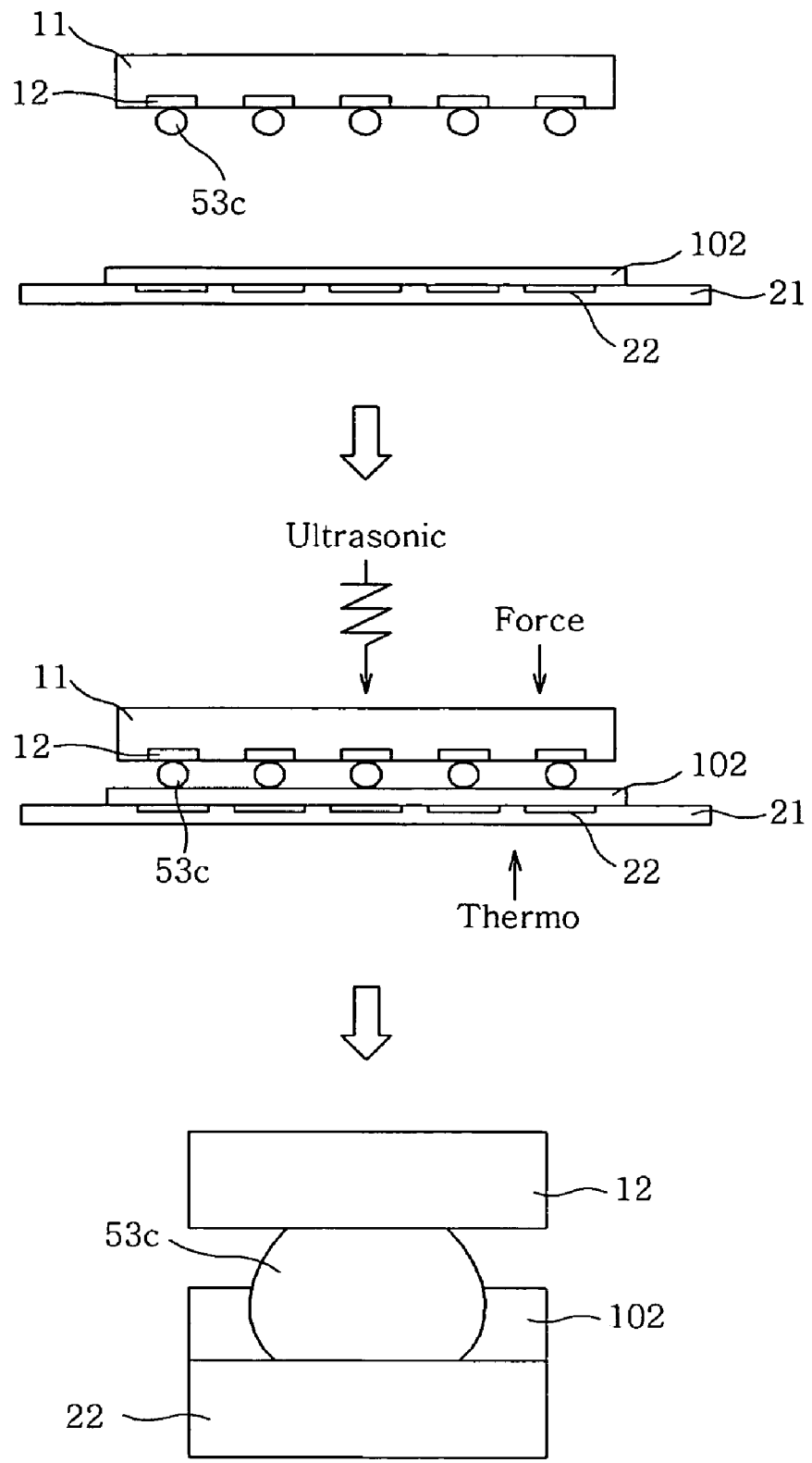

FIG. 36 is a view showing the process for a flip chip bonding between a base substrate on which an adhesive (for example, ACF, ACP, NCF or NCP) is applied and a chip that is formed with a stud bump 53c using a thermosonic method according to the invention.

Referring to FIG. 36, an aluminum bonding pad 12 of a chip 11 is formed with a stud bump 53c that is made of Au or Cu. A lead pad 22 of a substrate 21 is bare of any bump. An adhesive 102 that is selected from a group of Anisotropic Conductive Film (ACF), Anisotropic Conductive Paste (ACP), N on Conductive Film (NCF), and N on Conductive Paste (NCP) is applied on the lead pad 22 of the substrate 21. In the flip chip bonding process S5, after the chip 11 and the substrate 21 are closely contacted, heat is applied to the substrate 21, and an ultrasonic wave is applied to the chip 11 through a collet 95. Simultaneously, pressure is applied to the substrate 21. As a result, the stud bump 53c of the chip and the lead pad 22 of the substrate 21 are bonded by energy generated from the heat, the ultrasonic wave and the pressure.

EXAMPLE 9

Figure 37:
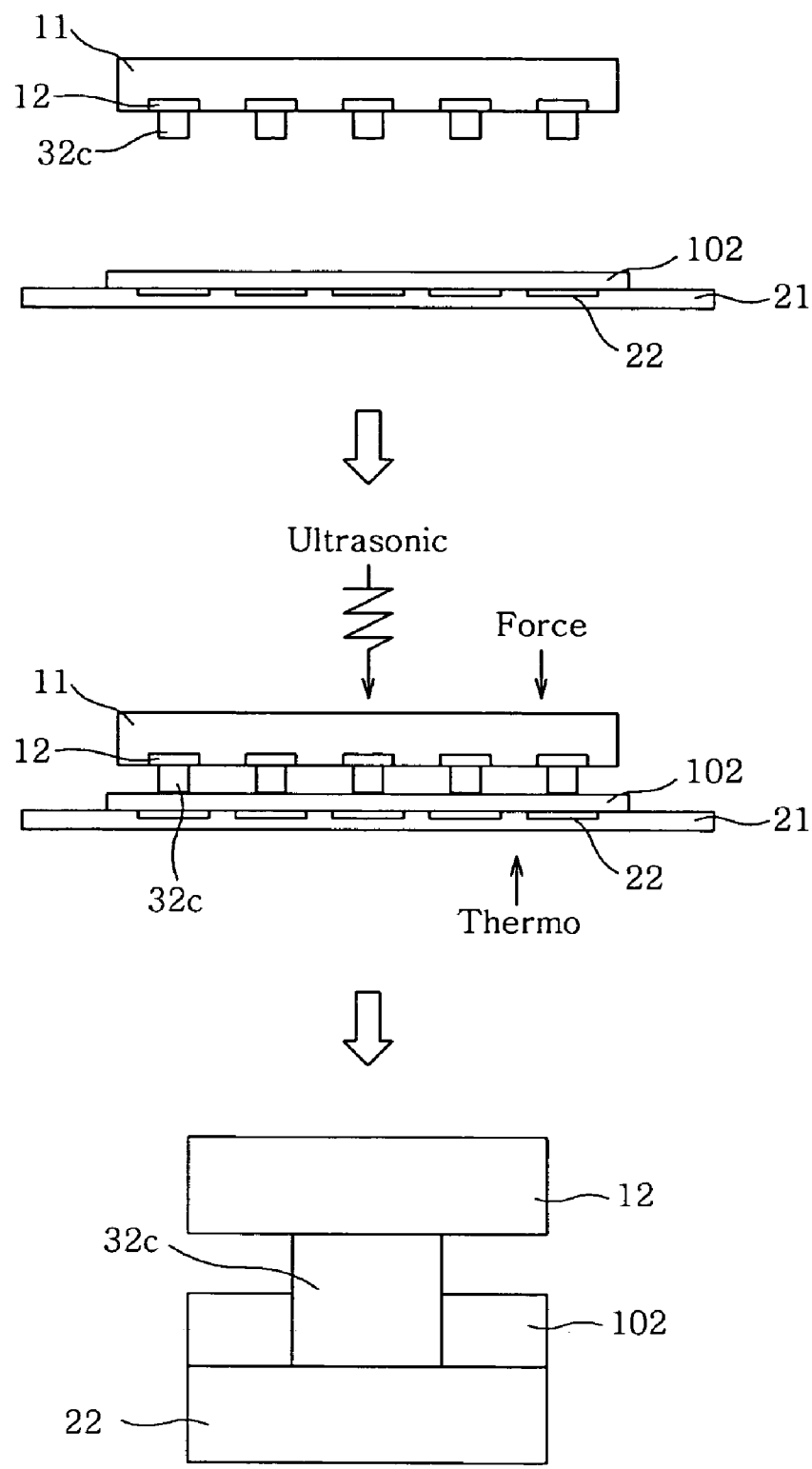

FIG. 37 is a view showing the process for a flip chip bonding between a base substrate on which an adhesive (ACF, ACP, NCF or NCP) is applied and a chip that is formed with a plated bump using a thermosonic method according to the invention.

Referring to FIG. 37, an aluminum bonding pad 12 of a chip 11 is formed with a plated bump 32c that is made of Au, Al, or Ni coated with Au. A lead pad 22 of a substrate 21 is bare of any bump. An adhesive 102 that is selected from ACF, ACP, NCF, and NCP is applied on the lead pad 22 of the substrate 21. In the flip chip bonding process S5, after the chip 11 and the substrate 21 are closely contacted, heat is applied to the substrate 21, and ultrasonic wave is applied to the chip 11 through a collet 95. Simultaneously, pressure is applied to the substrate 21. As a result, the plated bump 32c of the chip and the lead pad 22 of the substrate 21 are bonded by energy generated from the heat, the ultrasonic wave and the pressure.

From the foregoing, the bump formed on the substrate 21 or the chip 11 according to the invention comprises a plated bump that is made of Au or Al, a plated bump that is made of Ni coated with Au, a stud bump that is made of Au, a stud bump that is made of Cu and the like. Further, the substrate 21 may be a conventional PCB or FPCB. Further, the substrate 21 may be a substrate on which Sn is plated. In order to perform a flip chip process for having better adhesion force, ACF, ACP, NCF or NCP is applied on the substrate.

EXAMPLE 10

Figure 38:
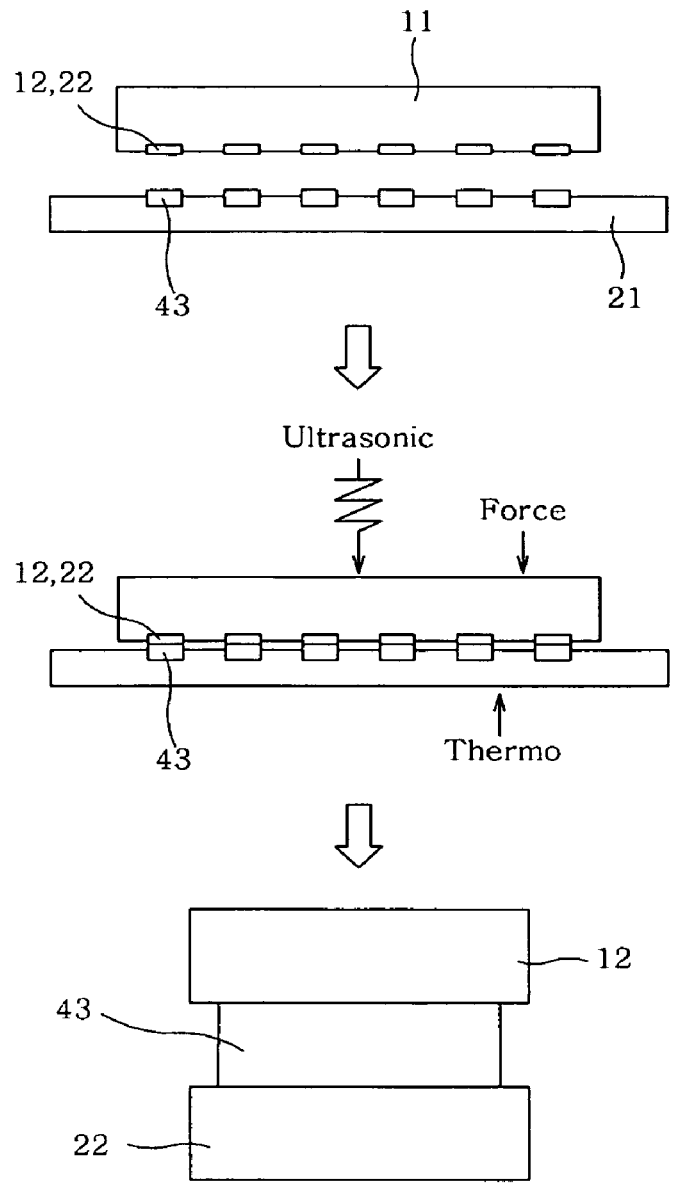

Referring to FIG. 38, a chip 11 may have an aluminum pad 12 that is formed with a plated bump 32c made of Au, Al or Ni coated with Au. Further, the chip 11 may have only the aluminum bonding pad 12 without forming the plated bump 32c. A substrate 21 may be formed with a doping bump 43. The chip 11 and the substrate 21 are bonded using an ultrasonic energy.

From the foregoing, according to a bonding means in the flip chip bonding process S5 of the invention, heat is applied to the substrate 21, ultrasonic wave is applied to the chip 11 through a collet 95, and pressure is applied to the substrate 21. As a result, the chip 11 and the substrate 21 are bonded by energy generated from the heat, the ultrasonic wave and the pressure. Thus, the invention has an advantage in that, since the present invention adopts a method for applying the ultrasonic wave as well as a thermocompression method without using only a conventional thermocompression method, a process time may be reduced compared to the conventional art. Further, in the case of using a substrate on which Sn is plated, or a substrate on which ACF, ACP, NCF or NCP is applied, a superior adhesion force may be obtained.

[Modification]

FIGS. 39 to 42 shows the examples of the bonding structure according to a relative size of a stud bump or a wedge bump and the example of applying ACF, ACP, NCF or NCP after forming a bump.

Figure 39:
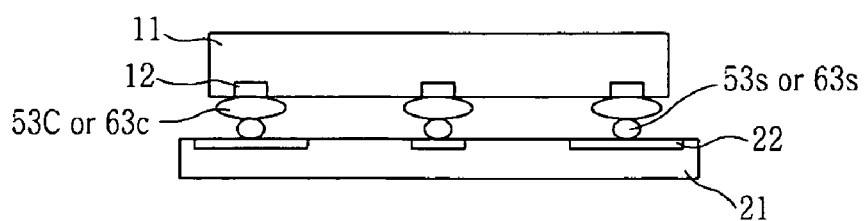
FIGS. 39 to 42 are views showing examples of a bonding structure according to the relative size of a stud bump or a wedge bump and examples of applying ACF, ACP, NCF or NCP after forming the bump.
Figure 40:
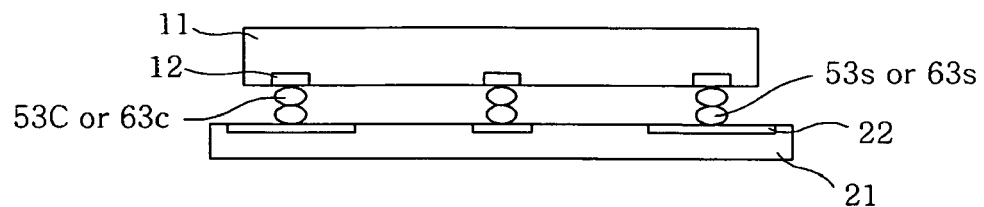
Figure 41:
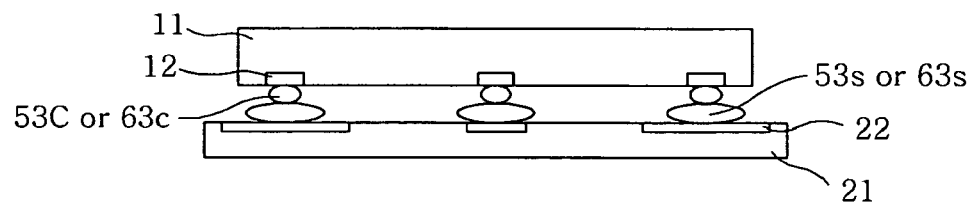

Specifically, in FIG. 39, a bump 53c or 63c of a chip 11 is larger than a bump 53s or 63s of a substrate 21. Further, in FIG. 40, a bump 53c or 63c has the same size as a bump 53s or 63s of a substrate 21. Further, in FIG. 41, a bump 53s or 63s of a substrate is larger than a bump 53c or 63c of a chip. From the foregoing, the bump 53c or 63c of the chip and the bump 53s or 63s of the substrate may be bonded while having the same size and kind or differing the size and kind thereof.

Figure 42:
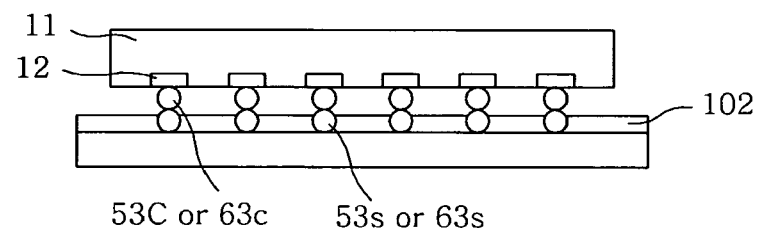

In FIG. 42, after forming a bump 54s or 63s on a substrate 21, an anisotropic conductive adhesive 102 or a nonconductive adhesive 102 such as ACF, ACP, NCF, NCP, and the like is applied, and then a chip 11 and the substrate 21 are immediately bonded. Thus, the process for filling resin may be removed. The process for applying the anisotropic conductive adhesive 102 or the nonconductive adhesive 102 such as ACF, ACP, NCF, NCP, and the like may be performed around the bump which is formed on the substrate 21. Further, the process may be performed around the entire substrate 21.

[Chip Stack]

Figure 43:
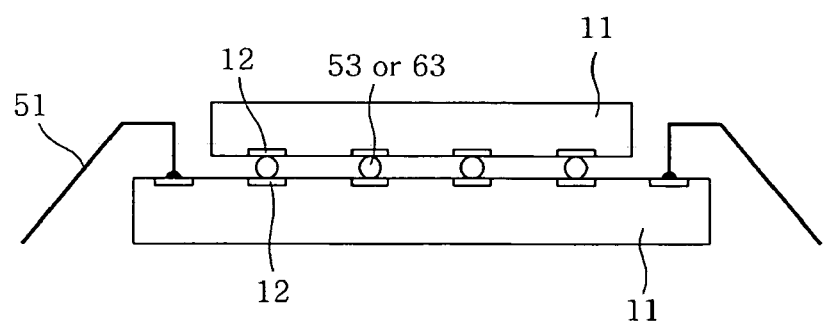
FIGS. 43 to 46 are views showing example of a chip stack method using a flip chip bonding process.

Referring to FIG. 43, a stud bump 53 or a wedge bump 63 is formed on a pad 12 of an upper chip 11 or a pad 12 of a lower chip 11. Here, the pad 12 of the lower chip has at least two rows. The pads of two chips 11 are positioned to face each other. Heat is applied to the lower chip 11, and ultrasonic wave and force are applied through a collet 95 to the upper chip 11. As a result, the upper chip 11 and the lower chip 11 are bonded to form a stacked chip. This stacked chip shows better performance than one chip.

Figure 44:
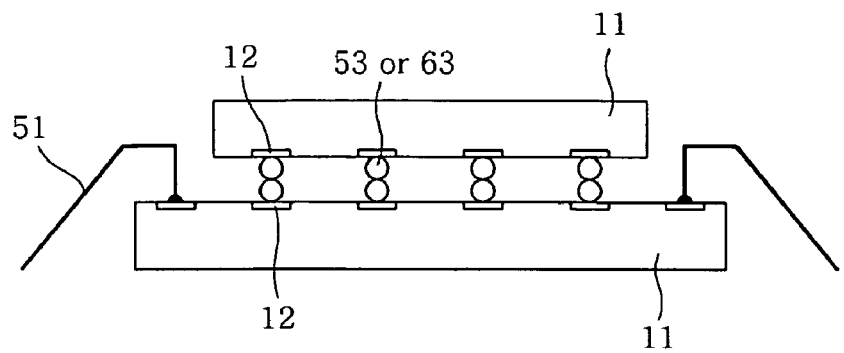

FIG. 44 shows a view for manufacturing a stacked chip according to the invention by forming a stud bump 53 or a wedge bump 63 on an upper chip 11, forming a stud bump 53 or a wedge bump 63 on a lower chip 11, facing them to each other, and applying ultrasonic waves and force using a tool.

Figure 45:
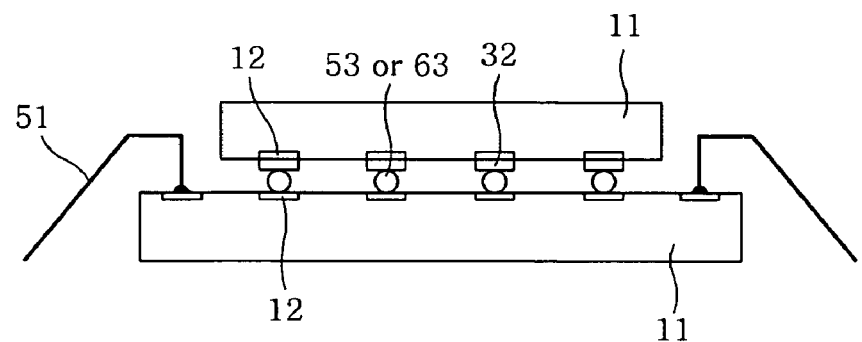

FIG. 45 shows a view for manufacturing a stacked chip according to the invention by forming a plated bump 32 on an upper chip 11, forming a stud bump 53 or a wedge bump 63 on a lower chip 11, and bonding them.

Figure 46:
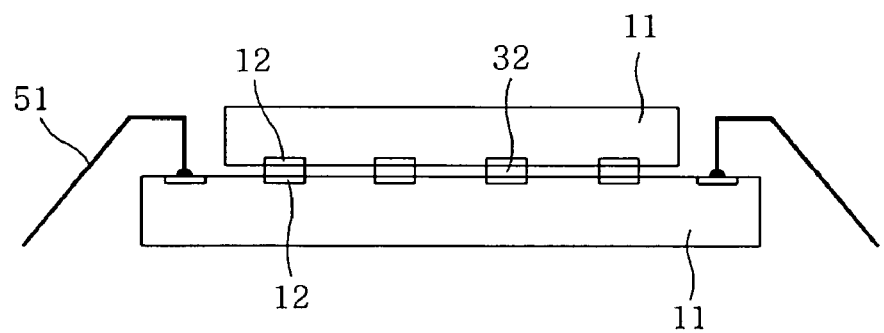

FIG. 46 shows a view for manufacturing a stacked chip according to the invention by forming a plated bump 32 on an upper chip 11, and bonding this chip 11 to a lower chip 11. The bump adopted in the chip-to-chip method as describe above is made by forming a wire with a metal having a good conductivity, such as Au, Ag, Al, and Cu.

[Post Treatment Process]

Figure 47:
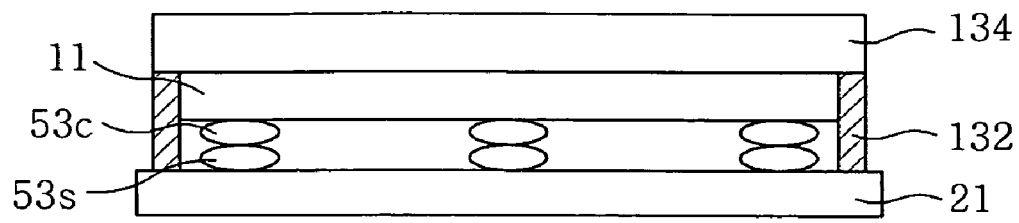
FIG. 47 is a view showing an example of a bonding post treatment process shown in FIG. 5.

After flip chip bonding process S5, in a post treatment process, if necessary, a resin is filled in a bonding space to protect a chip. FIG. 47 shows an example of forming a protection wall 132, forming bumps 53c, 53s and 63 on a chip 11 and a substrate 21, respectively, and forming a molding 134 on them. Specifically, if, in the pretreatment process, the protection wall 132 is formed around the chip and then a flip chip bonding is performed in a post treatment for under-fill and side sealing, an epoxy resin component is prevented from penetrating into a gap between the bump and the substrate. Here, the protection wall 132 may be made of NCP, NCF, ACF, ACP, epoxy, or a molding compound. After performing a flip chip bonding process, it is preferred that a curing process for hardening the protection wall 132 which is made of a soft material is added.

[Layer-Built Structure of Substrate]

Meanwhile, a layer-built structure of a substrate for bonding according to the invention comprises a substrate which is formed with a copper thin film pattern on a basic substance, a hard metal layer which is formed by plating a metal having a high hardness on the substrate, a conductive metal layer which is formed by plating a metal having a high conductivity on the hard metal layer. Thus, a bonding strength is maintained and a production yield is enhanced irrespective of a kind of the basic substance.

Figure 48:
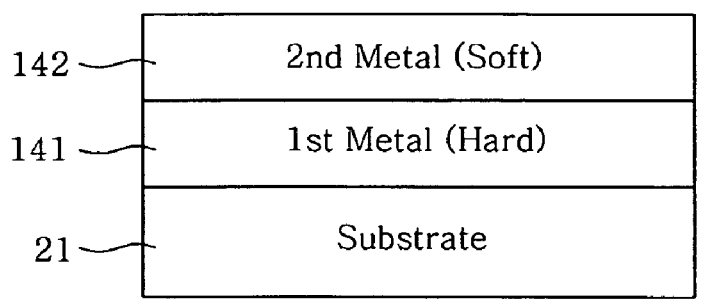
FIG. 48 is a view showing a first embodiment of a metal layer-built structure of a substrate for a flip chip bonding according to the invention.

FIG. 48 shows an example of a metal layer-built structure of a substrate for a stud bump according to the invention.

Referring to FIG. 48, a substrate 21 according to the invention is formed with a copper thin film pattern on a basic substance thereof. Here, the basic substance of the substrate is made of FPCB, FR4, FR5, ceramic or glass.

A first metal layer 141 and a second metal layer 142 are formed on the substrate 21 by a plating method. The first metal layer 141 serves as a buffer layer for cutting off the effect according to the kind of the substance of the substrate. It is formed by plating Pd alloy, Pd—Ni or Ni—Pd to have 3 microns or more in thickness. The second metal layer 142 serves as a part for directly connecting to a stud bump or the like in a bonding process. It is formed by plating Au or Ag having a good conductivity and purity, Au/Ag, Al, Au alloy, Ag alloy or Al alloy to have 0.1 microns or more in thickness.

Thus, since the buffer layer 141 of the hard metal for cutting off the effect according to the kind of the substrate is added, a bonding strength is maintained and a production yield is enhanced irrespective of the kind of the basic substance.

Figure 49:
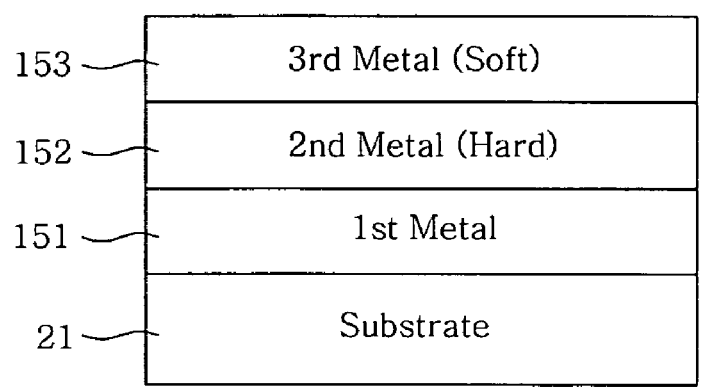
FIG. 49 is a view showing a second embodiment of a metal layer-built structure of a substrate for a flip chip bonding according to the invention.

FIG. 49 shows a layer-built structure having three layers as another embodiment of a metal layer-built structure of a substrate for each bump according to the invention.

Referring to FIG. 49, a substrate 21 according to the invention is formed with a copper thin film pattern on a basic substance thereof. Here, the basic substance of the substrate is made of FPCB, FR4, FR5, ceramic or glass.

A first metal layer 141, a second metal layer 142 and a third metal layer 143 are formed on the substrate 21 by a plating method.

The first metal layer 151 is formed by plating Ni or Ni alloy to have 3 microns or more in thickness. The second metal layer 152 serves as a buffer layer for cutting off the effect according to the kind of the substance of the substrate. It is formed by plating AU alloy to have 0.1 microns or more in thickness.

The third metal layer 153 serves as a part for directly connecting to each bump or the like in a bonding process. It uses Au or Ag having a good conductivity and purity, Al, Au alloy, Ag alloy or Al alloy.

Thus, since the buffer layer of the hard metal for cutting off the effect according to the kind of the substrate is added, a bonding strength is maintained and a production yield is enhanced irrespective of the kind of the basic substance.

From the foregoing, according to the invention, since ultrasonic wave is applied together with thermocompression upon a flip chip bonding process, the process may be quickly performed. Especially, a bonding property of a chip may be greatly enhanced by forming a stud bump or a plated bump on the chip, forming a bump on a substrate, and directly bonding the bumps. That is, the invention may enhance the bonding property by directly connecting the plated bump, a stud bump, a wedge bump or a doping bump using a collet and forming a new intermetallic area after bonding. Further, since a substrate plated with Al, Cu or Sn having a lower melting point than Au, electrical reliability is easily secured and adhesion force is superior. Thus, the flip chip bonding can be accomplished without damaging a chip pad even though a wafer having a weak pad, such as an image sensor and the like, is used.

Further, the invention provides a flip chip bonding device that applies an ultrasonic energy to only the chip or both the chip and the substrate for the flip chip bonding.

Further, according to the invention, since a metal having high hardness is plated on a substrate as a buffer layer for cutting off the effect according to the kind of a basic substance of the substrate, a bonding strength can be maintained and a production yield can be enhanced.

While preferred embodiments of the invention have been described, it is to be understood that modifications and variations will be apparent to those skilled in the art without departing from the spirit of the invention. The scope of the invention, therefore, is to be determined solely by the following claims. For example, equivalent materials and alloys may be substituted for the illustrative materials described herein.

What is claimed:

1. A flip chip bonding method for enhancing a bonding performance in a semiconductor packaging process for bonding a chip having bonding pads on a substrate having lead pads, the method comprising the steps of:

performing pretreatment of a wafer having chips, dicing the wafer, and obtaining a pretreated individual chip;

performing pretreatment of a substrate;

aligning the pads of the pretreated chip with the pads of the pretreated substrate, and bonding the chip and the substrate together by applying an ultrasonic wave and heat using a collet and simultaneously applying pressure wherein the ultrasonic wave is applied in a safe range of frequency, wherein the safe range is from about 50 KHz to about 100 KHz, or in the range for minimizing the loss of the ultrasonic energy, wherein the range is from about 100 KHz to about 250 KHz; and performing post treatment for filling or molding resin after bonding.

2. The method according to claim 1, wherein the lead pads of the substrate are plated with Au, Sn, or a high conductive metal.

3. The method according to claim 1, wherein the pretreatment step of the substrate includes one of passing the substrate in a bare status, forming a plated bump, forming a stud bump, forming a doping bump, and applying an adhesive.

4. The method according to claim 3, wherein the adhesive includes at least one of Anisotropic Conductive Film (ACF), Anisotropic Conductive Paste (ACP), Non Conductive Film (NCF), and Non Conductive Paste (NCP).

5. The method according to claim 1, wherein the pretreatment step of the wafer includes one of passing in a substrate in a bare state, forming a plated bump, forming a stud bump or a wedge bump, and forming a stud bump after forming a plated bump.

6. The method according to claim 3, wherein the plated bump is made of one of Au, Al and Ni coated with Au, and the stud bump is made of one of high conductive metal, Au, Ag, Al and Cu.

7. The method according to claim 3, wherein the plated bump provides an annealing effect for growing a particle size of metal to increase an adhesion force of the plated bump.

8. The method according to claim 3, wherein the bump of the substrate has the same size as the bump of the chip or any one of the bump of the substrate and the bump of the chip has a larger size than the other of them.

9. The method according to claim 3, wherein the bump that is formed on the wafer or the substrate uses any one of a long projection shape, a short projection shape, and a convex shape without having a projection.

10. The method according to claim 1, wherein the collet for holding the chip and transferring the ultrasonic energy is made of any one of Zr, Ti, ceramic, stainless alloy, TiW and TiC.

11. The method according to claim 10, wherein the collet is treated by Diamond Like Carbon coating using a diamond like carbon thin film to minimize the loss of the ultrasonic energy.

12. The method according to claim 10, wherein the collet adopts a polish mode for polishing a bottom surface of the collet or a matt mode for roughly treating a surface thereof by sanding or electro discharge machining to maximize the transfer of the ultrasonic energy.

13. The method according to claim 1, wherein the step for bonding the flip chip using the ultrasonic wave is performed by a flip chip bonder having the collet and a block for supporting the substrate, and the step for applying the ultrasonic wave may include one of the steps of transferring the ultrasonic wave in the direction of a X axis from the collet and transferring it in the direction of a Y axis from the block, transferring the ultrasonic wave in the direction of a Y axis from the collet and transferring it in the direction of a X axis from the block, and transferring the ultrasonic wave which intersects in the direction of the same axis from the collet and the block.

14. The method according to claim 13, wherein the step for applying the ultrasonic wave includes one of:
    applying the ultrasonic wave in the range of about 50 KHz to about 100 KHz from the collet and applying the ultrasonic wave in the range of about 100 KHz to about 250 KHz from the block;
    applying the ultrasonic wave in the range of about 100 KHz to about 250 KHz from the collet and applying the ultrasonic wave in the range of about 70 KHz to about 100 KHz from the block; and
    applying the ultrasonic wave in the same range of frequency from the collet and the block.

15. A method for manufacturing a stack flip chip, which bonds an upper chip on a lower chip to obtain a high performance in a unit area, the method comprising the steps of:
    forming one of a plated bump, a stud bump and a wedge bump on a chip of a wafer, dicing the wafer, and preparing an upper individual chip which is formed with any of the plated bump, the stud bump and the wedge bump;
    preparing the lower chip which is bare; and
    aligning the one of the plated bump, the stud bump and the wedge bump of the upper chip with the pad of the lower chip, and bonding the upper chip and the lower chip together by applying an ultrasonic wave and heat and simultaneously applying pressure wherein the ultrasonic wave is applied in a safe range of frequency, wherein the safe range is from about 50 KHz to about 100 KHz, or in the range for minimizing the loss of the ultrasonic energy, wherein the range is from about 100 KHz to about 250 KHz.

16. A method for manufacturing a stack flip chip, which bonds an upper chip on a lower chip to obtain a high performance in a unit area, the method comprising the steps of:
    forming any one selected from the group consisting of a plated bump, a stud bump and a wedge bump on a chip of a wafer, dicing the wafer, and preparing the upper individual chip which is formed with any one selected from the group consisting of the plated bump, the stud bump and the wedge bump;
    bonding a chip to on a substrate with adhesive resin series, forming a stud bump or a wedge bump on a pad of the chip, and preparing the lower chip; and
    aligning any one selected from the group consisting of the plated bump, the stud bump and the wedge bump of the upper chip with the stud bump or the wedge bump of the lower chip, and bonding the upper chip and the lower chip together by applying an ultrasonic wave and heat and simultaneously applying pressure wherein the ultrasonic wave is applied in a safe range of frequency, wherein the safe range is from about 50 KHz to about 100 KHz, or in the range for minimizing the loss of the ultrasonic energy, wherein the range is from about 100 KHz to about 250 KHz.

17. The method according to claim 5, wherein the plated bump is made of one of Au, Al and Ni coated with Au, and the stud bump is made of one of high conductive metal, Au, Ag, Al and Cu.

18. The method according to claim 5, wherein the plated bump provides an annealing effect for growing a particle size of metal to increase an adhesion force of the plated bump.

19. The method according to claim 5, wherein the bump of the substrate has the same size as the bump of the chip or any one of the bump of the substrate and the bump of the chip has a larger size than the other of them.

20. The method according to claim 5, wherein the bump that is formed on the wafer or the substrate uses any one of a long projection shape, a short projection shape, and a convex shape without having a projection.

21. A flip chip bonding method for enhancing a bonding performance in a semiconductor packaging process for bonding a chip having bonding pads on a substrate having lead pads, the method comprising the steps of:
    performing pretreatment of a wafer having chips, dicing the wafer, and obtaining the pretreated individual chip;
    performing pretreatment of a substrate;
    aligning the pads of the pretreated chip with the pads of the pretreated substrate, and bonding the chip and the substrate together by applying an ultrasonic wave and heat using a collet and simultaneously applying pressure wherein the collet is treated by Diamond Like Carbon coating using a diamond like carbon thin film to minimize the loss of the ultrasonic energy.

22. A flip chip bonding method for enhancing a bonding performance in a semiconductor packaging process for bonding a chip having bonding pads on a substrate having lead pads, the method comprising the steps of:
    performing pretreatment of a wafer having chips, dicing the wafer, and obtaining the pretreated individual chip;
    performing pretreatment of a substrate;
    aligning the pads of the pretreated chip with the pads of the pretreated substrate, and bonding the chip and the substrate together by applying an ultrasonic wave and heat using a collet and simultaneously applying pressure wherein the step for bonding the flip chip using the ultrasonic wave is performed by a flip chip bonder having the collet and a block for supporting the substrate, and the step for applying the ultrasonic wave may include one of the steps of transferring the ultrasonic wave in the direction of a X axis from the collet and transferring it in the direction of a Y axis from the block, transferring the ultrasonic wave in the direction of a Y axis from the collet and transferring it in the direction of a X axis from the block, and transferring the ultrasonic wave which intersects in the direction of the same axis from the collet and the block.

* * * * *